United States Patent
Henley

(10) Patent No.: US 11,444,221 B2
(45) Date of Patent: *Sep. 13, 2022

(54) LAYER TRANSFER OF FILMS UTILIZING CONTROLLED SHEAR REGION

(71) Applicant: Silicon Genesis Corporation, Santa Clara, CA (US)

(72) Inventor: Francois J. Henley, Santa Clara, CA (US)

(73) Assignee: Silicon Genesis Corporation, Fremont, CA (US)

( * ) Notice: Subject to any disclaimer, the term of this patent is extended or adjusted under 35 U.S.C. 154(b) by 101 days.

This patent is subject to a terminal disclaimer.

(21) Appl. No.: 16/504,168

(22) Filed: Jul. 5, 2019

(65) Prior Publication Data

US 2019/0326467 A1 Oct. 24, 2019

Related U.S. Application Data

(63) Continuation of application No. 15/145,714, filed on May 3, 2016, now abandoned, which is a continuation
(Continued)

(51) Int. Cl.
*H01L 31/18* (2006.01)
*H01L 21/762* (2006.01)
(Continued)

(52) U.S. Cl.
CPC .......... *H01L 31/1804* (2013.01); *B26F 3/004* (2013.01); *B26F 3/16* (2013.01);
(Continued)

(58) Field of Classification Search
None
See application file for complete search history.

(56) References Cited

U.S. PATENT DOCUMENTS

| 2,614,055 A | 10/1952 | Senarelens |
| 3,117,002 A | 1/1964 | Bronson et al. |

(Continued)

FOREIGN PATENT DOCUMENTS

| DE | 834363 | 3/1952 |
| DE | 19753494 | 10/1998 |
| EP | 084287 A1 | 7/1983 |
| EP | 099778 A1 | 2/1984 |
| EP | 155875 A1 | 2/1984 |
| EP | 112238 A2 | 6/1984 |

(Continued)

OTHER PUBLICATIONS

Adan et al., SOL as a mainstream IC technology Proceedings 1998 IEEE International SOL conference, Oct. 1998, pp. 9-12.
(Continued)

*Primary Examiner* — Geoffrey S Evans

(57) ABSTRACT

A film of material may be formed by providing a semiconductor substrate having a surface region and a cleave region located at a predetermined depth beneath the surface region. During a process of cleaving the film from the substrate, shear in the cleave region is carefully controlled. According to certain embodiments, an in-plane shear component (KII) is maintained near zero, sandwiched between a tensile region and a compressive region. In one embodiment, cleaving can be accomplished using a plate positioned over the substrate surface. The plate serves to constrain movement of the film during cleaving, and together with a localized thermal treatment reduces shear developed during the cleaving process. According to other embodiments, the KII component is purposefully maintained at a high level and serves to guide and drive fracture propagation through the cleave sequence.

19 Claims, 24 Drawing Sheets

Related U.S. Application Data of application No. 12/435,230, filed on May 4, 2009, now Pat. No. 9,362,439.

(60) Provisional application No. 61/051,307, filed on May 7, 2008.

(51) Int. Cl.
  *B26F 3/00* (2006.01)
  *B26F 3/16* (2006.01)

(52) U.S. Cl.
  CPC ........ *H01L 21/76254* (2013.01); *H01L 31/18* (2013.01); *Y10T 83/041* (2015.04); *Y10T 83/283* (2015.04)

(56) References Cited

U.S. PATENT DOCUMENTS

| | | |
|---|---|---|
| 3,225,820 A | 12/1965 | Riordan |
| 3,390,033 A | 6/1968 | Brown |
| 3,392,069 A | 7/1968 | Merkel et al. |
| 3,551,213 A | 12/1970 | Boyle |
| 3,770,499 A | 11/1973 | Crowe et al. |
| 3,786,359 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |
| 3,915,757 A | 10/1975 | Engel |
| 3,946,334 A | 3/1976 | Yonezu |
| 3,957,107 A | 5/1976 | Alotz et al. |
| 3,964,957 A | 6/1976 | Walsk |
| 3,993,909 A | 11/1976 | Drews et al. |
| 4,006,340 A | 2/1977 | Gorinas |
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,495,219 A | 1/1985 | Kato et al. |
| 4,500,563 A | 2/1985 | Ellenberger et al. |
| 4,508,056 A | 4/1985 | Bruel et al. |
| 4,530,149 A | 7/1985 | Jastrzebski et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo |
| 4,727,047 A | 2/1988 | Bozler et al. |
| 4,764,394 A | 8/1988 | Conrad |
| 4,766,086 A | 8/1988 | Ohshima et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reisman et al. |
| 4,894,709 A | 1/1990 | Phillips et al. |
| 4,906,594 A | 3/1990 | Yoneda |
| 4,931,405 A | 6/1990 | Kamijo et al. |
| 4,948,458 A | 8/1990 | Ogle |
| 4,952,273 A | 8/1990 | Popov |
| 4,956,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi et al. |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,141,878 A | 8/1992 | Benton et al. |
| 5,162,241 A | 11/1992 | Mori et al. |
| 5,196,355 A | 3/1993 | Wittkower |
| 5,198,071 A | 3/1993 | Scudder et al. |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,213,986 A | 5/1993 | Pinker et al. |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,403,434 A | 4/1995 | Moslehi |
| 5,404,079 A | 4/1995 | Ohkuni et al. |
| 5,405,480 A | 4/1995 | Benzing et al. |
| 5,409,563 A | 4/1995 | Cathey |
| 5,411,592 A | 5/1995 | Ovshinsky et al. |
| 5,413,679 A | 5/1995 | Godbey |
| 5,427,052 A | 6/1995 | Ohta et al. |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike et al. |
| 5,494,835 A | 2/1996 | Bruel |
| 5,504,328 A | 4/1996 | Bonser |

(56) References Cited

U.S. PATENT DOCUMENTS

| | | |
|---|---|---|
| 5,506,176 A | 4/1996 | Takizawa |
| 5,508,207 A | 4/1996 | Horai et al. |
| 5,514,235 A | 5/1996 | Mitani et al. |
| 5,518,965 A | 5/1996 | Menigaux |
| 5,528,397 A | 6/1996 | Zavracky et al. |
| 5,539,245 A | 6/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,686,980 A | 11/1997 | Hirayama et al. |
| 5,700,333 A | 12/1997 | Yamazaki et al. |
| 5,705,421 A | 1/1998 | Matsushita et al. |
| 5,710,057 A | 1/1998 | Kenney |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |
| 5,763,319 A | 6/1998 | Ling et al. |
| 5,783,022 A | 7/1998 | Cha et al. |
| 5,793,913 A | 8/1998 | Kovacic |
| 5,804,086 A | 9/1998 | Bruel |
| 5,811,348 A | 9/1998 | Matsushita et al. |
| 5,821,158 A | 10/1998 | Shishiguchi |
| 5,824,595 A | 10/1998 | Igel et al. |
| 5,827,751 A | 10/1998 | Nuyen |
| 5,840,590 A | 11/1998 | Nuyen |
| 5,841,931 A | 11/1998 | Foresi |
| 5,854,123 A | 12/1998 | Sato et al. |
| 5,863,830 A | 1/1999 | Bruel et al. |
| 5,869,387 A | 2/1999 | Sato et al. |
| 5,869,405 A | 2/1999 | Gonzalez et al. |
| 5,877,070 A | 3/1999 | Goesele et al. |
| 5,882,987 A | 3/1999 | Srikrishnan |
| 5,897,743 A | 4/1999 | Fujimoto et al. |
| 5,906,951 A | 5/1999 | Chu et al. |
| 5,909,627 A | 6/1999 | Egloff |
| 5,920,764 A | 7/1999 | Hanson et al. |
| 5,942,050 A | 8/1999 | Green et al. |
| 5,953,622 A | 9/1999 | Lee et al. |
| 5,966,620 A | 10/1999 | Sakaguchi et al. |
| 5,966,625 A | 10/1999 | Zhong et al. |
| 5,968,279 A | 10/1999 | MacLeish et al. |
| 5,985,742 A | 11/1999 | Henley et al. |
| 5,993,677 A | 11/1999 | Biasse et al. |
| 5,994,207 A | 11/1999 | Henley et al. |
| 6,004,868 A | 12/1999 | Rolfson et al. |
| 6,008,128 A | 12/1999 | Habuka et al. |
| 6,010,579 A | 1/2000 | Henley et al. |
| 6,013,563 A | 1/2000 | Henley et al. |
| 6,013,567 A | 1/2000 | Henley et al. |
| 6,020,252 A | 2/2000 | Aspar et al. |
| 6,023,039 A * | 2/2000 | Sawada ............... C03B 33/091 |
| | | 219/121.61 |
| 6,027,988 A | 2/2000 | Cheung et al. |
| 6,033,974 A | 3/2000 | Henley et al. |
| 6,048,411 A | 4/2000 | Henley et al. |
| 6,066,915 A | 5/2000 | Pepi |
| 6,077,383 A | 6/2000 | Laporte |
| 6,083,324 A | 7/2000 | Henley et al. |
| 6,103,599 A | 8/2000 | Henley et al. |
| 6,107,213 A | 8/2000 | Tayanaka |
| 6,107,653 A | 8/2000 | Fitzgerald |
| 6,120,597 A | 9/2000 | Levy et al. |
| 6,143,628 A | 11/2000 | Sato et al. |
| 6,150,239 A | 11/2000 | Goesele et al. |
| 6,159,824 A | 12/2000 | Henley et al. |
| 6,159,825 A * | 12/2000 | Henley ............... B81C 1/0038 |
| | | 438/460 |
| 6,162,705 A | 12/2000 | Henley et al. |
| 6,171,965 B1 | 1/2001 | Kang |
| 6,171,982 B1 | 1/2001 | Sato |
| 6,184,111 B1 | 2/2001 | Henley et al. |
| 6,186,384 B1 * | 2/2001 | Sawada ............... C03B 33/091 |
| | | 225/2 |
| 6,190,998 B1 | 2/2001 | Bruel et al. |
| 6,191,007 B1 | 2/2001 | Matsui et al. |
| 6,194,327 B1 | 2/2001 | Gonzalez et al. |
| 6,204,151 B1 | 3/2001 | Malik et al. |
| 6,214,701 B1 | 4/2001 | Matsushita et al. |
| 6,225,192 B1 | 5/2001 | Aspar et al. |
| 6,251,754 B1 | 6/2001 | Ohshima et al. |
| 6,263,941 B1 | 7/2001 | Bryan et al. |
| 6,274,464 B2 | 8/2001 | Drobny et al. |
| 6,287,941 B1 | 9/2001 | Kang et al. |
| 6,291,321 B1 | 9/2001 | Fitzgerald |
| 6,297,748 B1 | 9/2001 | Sakaguchi et al. |
| 6,335,269 B1 | 1/2002 | Sato |
| 6,342,436 B1 | 1/2002 | Takizawa |
| 6,376,806 B2 | 4/2002 | Yoo |
| 6,452,091 B1 | 9/2002 | Nakagawa et al. |
| 6,455,397 B1 | 9/2002 | Belford |
| 6,455,399 B2 | 9/2002 | Malik et al. |
| 6,503,773 B2 | 1/2003 | Fitzgerald |
| 6,513,564 B2 | 2/2003 | Bryan et al. |
| 6,514,836 B2 | 2/2003 | Belford |
| 6,534,381 B2 | 3/2003 | Cheung et al. |
| 6,563,152 B2 | 5/2003 | Roberts et al. |
| 6,621,131 B2 | 9/2003 | Murthy et al. |
| 6,649,859 B2 * | 11/2003 | Miura ..................... H01J 37/301 |
| | | 219/121.21 |
| 6,723,661 B2 | 4/2004 | Fitzgerald |
| 6,809,009 B2 | 10/2004 | Aspar et al. |
| 6,858,107 B2 | 2/2005 | Ghyselen et al. |
| 6,911,376 B2 | 6/2005 | Yoo |
| 6,969,668 B1 | 11/2005 | Kang et al. |
| 7,019,339 B2 | 3/2006 | Atwater |
| 7,354,815 B2 | 4/2008 | Henley |
| 9,362,439 B2 * | 6/2016 | Henley ............... H01L 31/1804 |
| 2001/0019371 A1 | 9/2001 | Zavracky et al. |
| 2001/0039095 A1 | 11/2001 | Marty |
| 2002/0174828 A1 | 11/2002 | Vasat et al. |
| 2003/0077885 A1 | 4/2003 | Aspar et al. |
| 2003/0096098 A1 | 5/2003 | Ovshinsky et al. |
| 2003/0140844 A1 | 7/2003 | Maa et al. |
| 2003/0162367 A1 * | 8/2003 | Roche ............... H01L 21/76254 |
| | | 438/460 |
| 2003/0186493 A1 | 10/2003 | Iwasaki et al. |
| 2004/0253794 A1 | 12/2004 | Faris |
| 2005/0016837 A1 * | 1/2005 | Bruel ..................... C23C 14/48 |
| | | 204/192.32 |
| 2005/0118754 A1 | 6/2005 | Henley et al. |
| 2005/0189013 A1 | 9/2005 | Hartley |
| 2006/0014366 A1 | 1/2006 | Currie |
| 2006/0030122 A1 | 2/2006 | Shimoda et al. |
| 2006/0038182 A1 | 2/2006 | Rogers et al. |
| 2008/0173815 A1 * | 7/2008 | Nakasuji ............... H01J 37/185 |
| | | 250/310 |
| 2008/0188011 A1 * | 8/2008 | Henley .................... H01J 37/20 |
| | | 438/5 |
| 2009/0056513 A1 * | 3/2009 | Baer ..................... B23K 26/40 |
| | | 83/15 |

FOREIGN PATENT DOCUMENTS

| | | |
|---|---|---|
| EP | 181249 A1 | 5/1986 |
| EP | 112230 A1 | 4/1987 |
| EP | 0296804 | 12/1988 |
| EP | 164281 A1 | 2/1989 |
| EP | 355913 A1 | 2/1990 |
| EP | 379828 | 8/1990 |
| EP | 459177 | 12/1991 |
| EP | 504714 A2 | 9/1992 |
| EP | 533551 A1 | 3/1993 |
| EP | 0553852 | 8/1993 |
| EP | 660140 A1 | 6/1995 |
| EP | 665587 A1 | 8/1995 |
| EP | 0665588 A1 | 8/1995 |
| EP | 703609 A1 | 3/1996 |

(56) References Cited

FOREIGN PATENT DOCUMENTS

| | | |
|---|---|---|
| EP | 763849 A1 | 3/1997 |
| EP | 0807970 | 11/1997 |
| EP | 0843344 | 5/1998 |
| EP | 867917 A2 | 9/1998 |
| EP | 867921 A2 | 9/1998 |
| EP | 0905767 | 3/1999 |
| EP | 961312 A2 | 12/1999 |
| EP | 0971395 | 1/2000 |
| EP | 1085562 | 3/2001 |
| FR | 1558881 | 2/1969 |
| FR | 2235474 A1 | 1/1975 |
| FR | 2261802 A1 | 9/1975 |
| FR | 2266304 A | 10/1975 |
| FR | 2298880 A1 | 8/1976 |
| FR | 2519437 A1 | 7/1983 |
| FR | 2529383 A1 | 12/1983 |
| FR | 2575601 A1 | 7/1984 |
| FR | 2537768 A1 | 8/1985 |
| FR | 2560426 A1 | 8/1985 |
| FR | 2563377 A1 | 10/1985 |
| FR | 2537777 A1 | 4/1986 |
| FR | 2681472 A1 | 3/1993 |
| FR | 2714524 A1 | 6/1995 |
| FR | 2715501 A1 | 7/1995 |
| FR | 2715502 A1 | 7/1995 |
| FR | 2715503 | 7/1995 |
| FR | 2720189 A1 | 11/1995 |
| FR | 2725074 A1 | 3/1996 |
| GB | 2211991 A | 7/1989 |
| GB | 2231197 A | 11/1990 |
| JP | 53-104156 A | 9/1978 |
| JP | 58-030145 | 2/1983 |
| JP | 58-144475 A | 8/1983 |
| JP | 59-046750 A | 3/1984 |
| JP | 59-054217 A | 3/1984 |
| JP | 59-114744 A | 7/1984 |
| JP | 59-139539 | 8/1984 |
| JP | 59-193904 | 11/1984 |
| JP | 60-207237 A | 10/1985 |
| JP | 60-235434 A2 | 11/1985 |
| JP | 61-125012 | 6/1986 |
| JP | 3-109731 A | 5/1991 |
| JP | 3-132055 A | 6/1991 |
| JP | 3-265156 A | 11/1991 |
| JP | 4-076503 | 3/1992 |
| JP | 4-246594 A | 9/1992 |
| JP | 4-298023 A | 10/1992 |
| JP | 5-211128 A | 8/1993 |
| JP | 5-218053 | 8/1993 |
| JP | 7-164728 | 6/1995 |
| JP | 7-215800 A | 8/1995 |
| JP | 7-254690 A | 10/1995 |
| JP | 7-263291 A | 10/1995 |
| JP | 8-097389 A | 4/1996 |
| JP | 10-200080 A | 7/1998 |
| JP | 10-275905 | 10/1998 |
| JP | 11-045840 A | 2/1999 |
| JP | 2901031 B2 | 6/1999 |
| JP | 2910001 B2 | 6/1999 |
| JP | 2000-94317 A | 4/2000 |
| WO | WO 9510718 A1 | 4/1995 |
| WO | WO 9520824 A1 | 8/1995 |
| WO | WO 9531825 A1 | 11/1995 |
| WO | WO 9935674 A1 | 7/1999 |
| WO | WO 0063965 | 10/2000 |
| WO | WO 0154175 | 7/2001 |

OTHER PUBLICATIONS

Alles et al., Thin Film Silicon on Insulator: An Enabling Technology, Semiconductor International, pp. 67-72 (1997).
Auberton-Herve, "SOI: Materials to Systems", International Electron Devices Meeting, 1996, San Francisco, CA, USA, Dec. 8-11, 1996, New York, NY, USA, IEEE, US, Dec. 8, 1996, pp. 3-10.
Basta, Ion-Beam Implantation, High Technology (1985).
Belford et al., Performance-Augmented CMOS using Back-end Uni axial Strain 2002 Device Research Conference, Santa Barbara, CA.
Brendel, A Novel Process For Ultrathin Monocrystalline Silicon Solar Cells On Glass, 14th European Photovoltaic Solar Energy Conference Barcelona, Spain, Jun. 30-Jul. 4, 1997.
Burggraff, Advanced Plasma Source: What's Working?, Semiconductor International, pp. 56-59 (May 1994).
Carter et al., "The Collection of IONS Implanted in Semiconductors II. Range distributions Derived from Collection and Sputter-Etch Curves," Radiation Effects, vol. 16, pp. 107-114 (1972).
Cassidy, Ion Implantation Process Toughens Metalworking Tools, Modern Metals, pp. 65-67 (1984).
Centura EPI "Epitaxial Deposition Chamber Specifications" Brochure, Applied Materials, Mar. 1994.
Cheung, Plasma Immersion Ion Implantation for Semiconductor Processing, Material Chemistry and Physics, 46(2-3): 132-139 (1996).
Cho et al., "Vapor Etching of Silicon Substrates with HCl Gas" Journal of the Korean Institute of Electronic Engineering, Apr. 25, 1984, pp. 41-45, vol. 21, No. 5.
Choyke et al., A Comparative Study of Near-Surface Effects Due to Very High Fluence H+ Implantation in Single Crystal FZ, CZ, and Web SI, Mat. Res. Soc. Symp. Proc., 27:359-364 (1984).
Choyke et al., Implanted Hydrogen Effects at High Concentrations in Model Low Z Shielding Materials, J. Nuc. Mtrls, 122-23:1585-86 (1984).
Choyke et al., Mechanical Response of Single Crystal Si to Very High Fluence H+ Implantation, Nuc. Instr. Meth., 209-210:407-412 (1983).
Chuang et al., Design Considerations of SOI Digital CMOS VLSI, Proceedings 1998 IEEE International SOI Conference, Oct. 1998, pp. 5-8.
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc, 438:333-343 (1997).
Comita et al., Low Temperature SI and SIGe Epitaxy for sub 01.I-Im Technology, AMAT Conference Paper, Mar. 10, 2003.
Corbett et al., Embrittlement of Materials: Si(H) as a Model System, J. Nuc. Mtrls., 169: 179-184 (1989).
Deegan et al., Wavy and rough cracks in silicon. Center for Nonlinear Dynamics and Department of Physics, The University of Texas at Austin, Austin, Texas 78712, USA, Phys. Rev. E 67, 066209 (2003) [7 pages].
EPI Centura, Systems Specifications Brochure, Applied Materials, Oct. 1996.
European Patent Search Report for European Application No. 07016247.4, dated Apr. 24, 2008, 8 pages total.
European Patent Search Report for European Application No. 08153348.1, dated Jun. 3, 2008, 8 pages total.
Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.
Ge et al., Process-Strained Si (PSS) CMOS Technology Featuring 3D Strain Engineering, IEEE International Electron Devices Meeting, Washington, DC, Dec. 2003.
Grovernor, C.R.M., Microelectric Materials (1989), pp. 73-75.
Habuka et al., Change in Microroughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.
Hobart et al., "Fabrication of SOI Substrates with Ultra-Thin Si Layers" Electronics Letters, IEE Stevenage, GB, vol. 34, No. 12, Jun. 11, 1998 (Jun. 11, 1998), pp. 1265-1267.
Hobart et al., "Ultra-Cut: A Simple Technique for the Fabrication of SOI Substrates with Ultra-Thin (>5 nm) Silicon Films," IEEE

(56) References Cited

OTHER PUBLICATIONS

International SOI Conference, 1998. Proceedings, Stuart, FL, USA, Oct. 5-8, 1998, New York, NY, USA, IEEE, US, Oct. 5, 1998, pp. 145-146.
Hulett et al., Ion Nitriding and Ion Implantation: A Comparison, Metal Progress, pp. 18-21 (1985).
I.B.M., Technical Disclosure Bulletin, vol. 29: No. 3, p. 1416 (Aug. 1986).
International Search Report and Written Opinion of PCT Application No. PCT/US07/78023, dated Jul. 25, 2008, 13 pages total.
IOE's Smooth Approach Increases Carrier Mobilities, News, www.compoundsemiconductor.net, Dec. 2004.
Johnson et al., Hydrogen-Induced Platelets in Silicon: Separation of Nucleation and Growth, Mtrls. Sci. Forum, 83-87:33-38 (1992).
Krivokapic et al., "Strain Relaxation in Narrow Wdth Strained Silicon Devices with Poly and Metal Gates", Electrochemical Society Proceedings vol. 2004-07, pp. 459-469, Pennington, New Jersey USA (2004).
Lawn, Fracture Of Brittle Solids, Second Edition, NIST Fellow, Cambridge University Press, pp. 1-13. (1993).
Lee et al., A Novel Pattern Transfer Process for Bonded SOI Giga-bit DRAMS, 1996 IEEE Int'l. SOI Conference Proceedings, IEEE Election Devices Society, (1996.).
Lee et al., Strained Silicon Thin-Film Transistors Fabricated on Glass, Appl. Phys. Lett 86, 103504 (2005).
Li, Novel Semiconductor Substrate Formed by Hydrogen Ion Implantation into Silicon, Appl. Phys. Lett., 55(21):2223-2224 (1989).
Lu et al., SOI Material Technology Using Plasma Immersion Ion Implantation, Proceedings 1996 IEEE International SOI Conference (Oct. 1996).
Mahajan et al., Principles of Growth and Processing Semiconductors, WCB McGraw-Hill, chapter 6, pp. 262-269. (1999).
Mantl et al. Enhanced Strain Relaxation of Epitaxial SiGe-Layers ON Si(100) Improved by Hydrogen Implantation, Nuclear Instruments and Methods in Physics Research Section B, Jan. 1999, v. 147, Issue 1-4, p. 29-34.
Matsuda et al., Large Diameter Ion Beam Implantation System, Nuclear Instruments and Methods, B21:314-316 (1987).
Merriam Webster's Collegiate Dictionary, 10th Ed., p. 388. (1993).
Milnes et al., Peeled Film Technology for Solar Cells, pp. 338-341. (1975).
Moreau, Semiconductor Lithography, Principles, Practices, and Materials, Plenum Press (1988).
Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.
Morrison et al., Deposition of Micro-Crystalline Silicon using a Graphite Filament in the HotWire CVD Technique, J. Vac. Sci. Technol A19 (6), Nov. Dec. 2001, p. 2817.
Mukashev et al., Hydrogen Implantation into Silicon: Infra-Red Absorption Spectra and Electrical Properties, Institute of High Energy Physics, Academy of Sciences of the Kazakh SSR, Alma-Ata 1; 91, 509 (1985).
Onojima et al., Lattice Relaxation Process of A 1 N Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.
Oshima et al., Defects in Si Irradiated with D-T neutrons, D and He Ions, J. Nuc. Mtrls., 179-181:947-950 (1991).
Picraux et al., Ion Implantation of Surfaces, Scientific American, 252(3):102-113 (1985).
Renier et al., A New Low-Energy Ion Implanter for Bombardment of Cylindrical Surfaces, Vacuum, 35(12):577-578 (1985).
Saenger et al., Amorphization/templated recrystallization Method for Changing the Orientation of Single-Crystal Silicon: An Alternative Approach to Hybrid Orientation Substrates, Appl. Phys. Lett. 87, 221911, 2005.
Sato et al., Suppression of Si Etching During Hydrogen Annealing of Silicon-on-Insulator, Proceedings of 1998 IEEE Int. SOI Conference, pp. 17-18 from conference held Oct. 5-8, 1998.
Sherman et al., Energy Considerations In Crack Deflection Phenomenon In Single Crystal Silicon, International Journal of Fracture, vol. 140, Nos. 1-4, 2006 , pp. 125-140(16).
Sioshansi, Ion Beam Modification of Materials for Industry, Thin Solid Film, 118:61-71 (1984).
Smith, Thin Film Deposition, McGraw-Hili Inc., pp. 185-196,278-293. (1995).
Sze, VLSI Technology, 2nd Edition, pp. 9-101, (1988).
Tate et al., Defect Reduction of Bonded SOI Wafers by Post Anneal Process in H/sub 2/Ambient, Proceedings of 1998 IEEE Int. SOI Conference, pp. 141-142 from conference held Oct. 5-8, 1998.
Thompson, Strained Silicon MOSFETs: The Next Material Change to Extend Moore's Law, University of Florida, Spring MRS 2004.
Tong et al., A Smarter-cut approach to low temperature silicon layer transfer, Appl. Phys. Lett., 72(1): 49-51 (1998).
Tong et al., Semiconductor Wafer Bonding: Science and Technology, John Wiley & Sons, Inc., pp. 152-171 (1999).
U.S. Dept. of Energy, The Fusion Connection, Plasma Coating (1985).
Veldkamp et al., Binary Optics, Scientific American, pp. 50-55 (May 1992).
Weldon et al., On The Mechanism of The Hydrogen-Induced Exfoliation of Silicon, J. Vac. Science Tech. B, 15(4), Jul./Aug. 1997.
Wolf et al., Silicon Processing forthe VLSI Era vol. 1—Process Technology, pp. 547-549, 1986 by Lattice Press, Sunset Beach, California, ISBN 0-961672-3-7, Reprinted with corrections Jun. 1987.
Wolf et al., Silicon Processing for the VLSI Era vol. 1—Process Technology, p. 139, 1986 by Lattice Press, Sunset Beach, California, ISBN 0-961672-3-7, Reprinted with corrections Jun. 1987.
Wolf, Silicon Processing forthe VLSI Era vol. 2, pp. 66-79, Lattice Press (1990).
Wu et al., From Incident Laser Pulse to Residual Stress: A Complete and Self-closed Model for Laser Shock Peening, Feb. 2007., Journal of Manufacturing Science & Engineering, vol. 129, pp. 117-125.
Wu et al., Two dimensional hydrodynamic simulation of high pressures induced by high power nanosecond laser-matter interactions underwater, Journal of Applied Physics, May 2007, vol. 101, Issue 10, pp. 103514-103514-8.
Yaguchi et al., Strain Relaxation in MBE-Grown SI1-SGEXISU (100) Heterostructures by Annealing, Japanese Journal of Applied Physics, Tokyo, JP, v. 30, No. 8B Part 2, Aug. 1991, pp. L 1450-L 1453.
Yamada et al., Thermal Damage Of Silicon Wafer In Thermal Cleaving Process With Pulsed Laser And CW Laser, Laser-based Micropackaging, edited by Friedrich G. Bachmann, Willem Hoving, Yongfeng Lu, Kunihiko Washio, Proc, of SPIE vol. 6107, 61070H, (2006).
Yang et al., High Performance CMOS Fabricated on Hybrid Substrate with Different Crystal Orientations, IEDM Tech. Dig., 2003, pp. 453-456.
Yang et al., On the Integration of CMOS with Hybrid Crystal Orientations, 2004 Symposium on VLSI Technology Digest of Technical Papers, 2004.
Yun et al., Study on the Etching Reaction of Silicon with Carbon Tetrafluoride in Electron Cyclotron Resonance Plasma Etching System, Journal of the Korean Institute of Chemical Engineers, Jun. 1993, pp. 255-262, Hwahak Konghak vol. 32, No. 3.
Zhang et al., Microscale Laser Shock Peening Of Thin Films, Part 1: Experiment, Modeling And Simulation, vol. 126, No. 1, Feb. 2004, pp. 10-17.
Zheng et al., Orientation dependence of blistering in H-implanted Si, Department of Electrical and Computer Engineering, University of California, San Diego, La Jolla, California 92093-0407 , J. Appl. Phys. 89, 2972 (2001).

\* cited by examiner

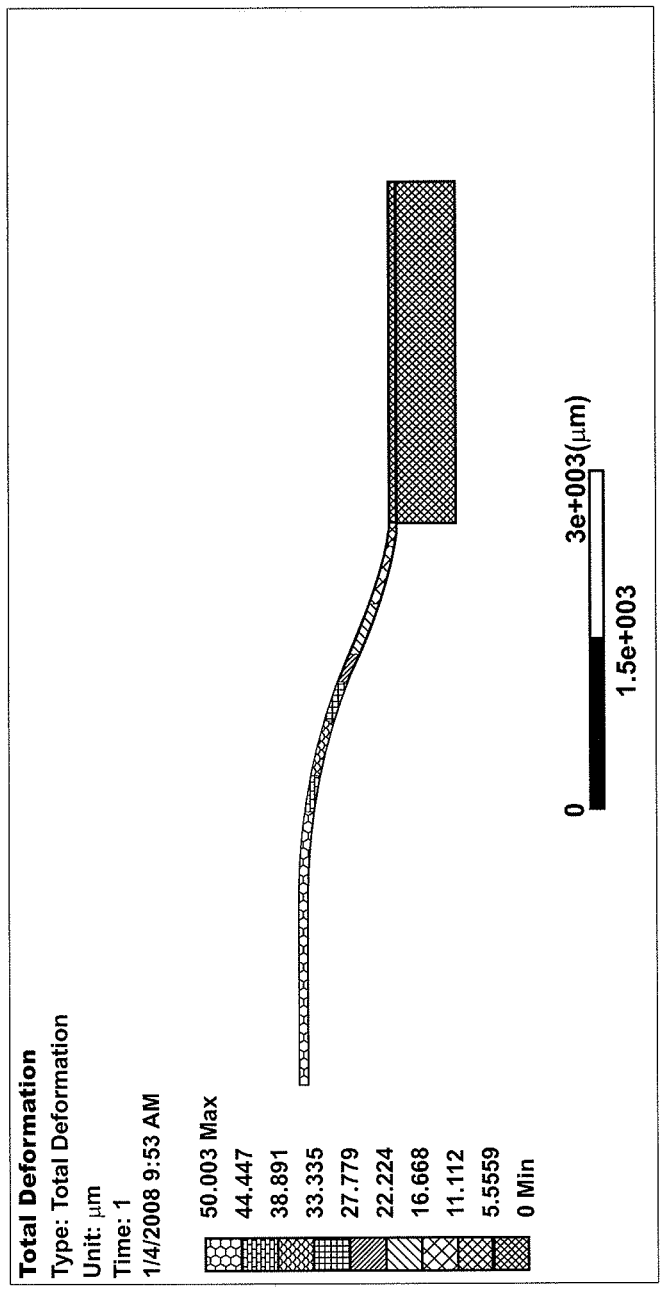

LAYER TRANSFER OF FILMS UTILIZING CONTROLLED SHEAR REGION

CROSS-REFERENCE TO RELATED APPLICATION

The instant nonprovisional patent application is a continuation of and claims priority to U.S. application Ser. No. 15/145,714, filed May 3, 2016, which is a continuation of U.S. application Ser. No. 12/435,230 filed May 4, 2009, which claims priority to U.S. Provisional Patent Application No. 61/051,307, filed May 7, 2008, all of which are incorporated by reference in their entirety herein for all purposes.

BACKGROUND OF THE INVENTION

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells often rely upon starting materials such as silicon. Such silicon is often made using either polysilicon and/or single crystal silicon materials. Polysilicon material can also, depending on the size of single-crystal grains and degree of crystallinity, called multicrystalline, microcrystalline, or nanocrystalline. These materials will henceforth be called "polysilicon", as opposed to single crystal (monocrystalline) material which does not have numerous random crystal orientations and numerous grain boundaries. Amorphous silicon is not a form of silicon commonly used in wafered solar cells due to its poor carrier lifetime in thicknesses less than a few microns.

The materials for solar cells are often difficult to manufacture. Polysilicon cells are often formed by manufacturing polysilicon plates. Although these plates may be formed in a cost effective manner using crystallization furnaces, they do not possess optimum properties for highly effective solar cells. In particular, polysilicon plates do not exhibit the highest possible efficiency in capturing solar energy and converting the captured solar energy into usable electrical power.

By contrast, single crystal silicon (c-Si) has suitable properties for high grade solar cells. Such single crystal silicon is, however, expensive to manufacture and is also difficult to use for solar applications in an efficient and cost effective manner.

Additionally, both polysilicon and single-crystal silicon materials suffer from material losses during conventional manufacturing single crystal silicon substrates, where a sawing process is used to physically separate thin single crystal silicon layers from a single crystal silicon ingot originally grown. For example, inner diameter (ID) sawing process or wire sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

To overcome drawbacks of using silicon materials, thin-film solar cells have been proposed. Thin film solar cells are often less expensive by using less silicon material or alternative materials but their amorphous or polycrystalline structure are less efficient than the more expensive bulk silicon cells made from single-crystal silicon substrates.

From the above, it is seen that techniques to manufacture suitable high quality single crystal silicon sheets with low cost and high productivity are highly desired.

BRIEF SUMMARY OF THE INVENTION

A film of material may be formed by providing a semiconductor substrate having a surface region and a cleave region located at a predetermined depth beneath the surface region. During a process of cleaving the film from the substrate, shear in the cleave region is carefully controlled. According to certain embodiments, an in-plane shear component (KII) is maintained near zero, sandwiched between a tensile region and a compressive region. In one embodiment, cleaving can be accomplished using a plate positioned over the substrate surface. The plate serves to constrain movement of the film during cleaving, and together with a localized thermal treatment reduces shear developed during the cleaving process. According to other embodiments, the KII component is purposefully maintained at a high level and serves to guide and drive fracture propagation through the cleave sequence. In one embodiment, the high KII component is achieved by adiabatic heating of silicon through exposure to E-beam radiation, which imparts a highly abrupt thermal gradient and resulting stress at a precisely defined depth in the silicon.

Embodiments of the present invention relate generally to layer transfer techniques for forming thick films. More particularly, the present invention provides a method and device for low or even implant free layer transfer of thick films for solar cells. Merely by example, it is applied to cleave thick films along a crystallographic plane of single crystal silicon substrate. But it will be recognized that the invention has a wider range of applicability.

Many benefits can be obtained by implementing the present invention. In a preferred embodiment, single crystal silicon ingot substrate with a surface plane in an {111} or {110} crystallographic plane can be selected. Thus, the ion implantation process for creating cleave region can be mostly eliminated or limited to form a cleave initiation region with a portion of peripheral region. This substantially simplifies the layer transfer process, reduces system energy cost and increases productivity.

In certain embodiments, the process is divided into (i) an initiation process utilizing a higher implant dose (the initiation dose) to initiate a fracture in a relatively small area of the silicon ingot substrate (the initiation region), and (ii) a propagation process that extends the initiated crack tip through the remainder of the silicon ingot substrate to release the thick film (the propagation region). Since the propagation process must extend the initiation region through the majority of the surface area of the thick film to be released, this process should operate reliably with a small implant dose, and perhaps without any dose. This is called the propagation dose, and the total dose needed for the process would therefore be the weighted area average of the initiation and propagation dose. For example, if the initiation area is 1% of the total area and utilizes $6\times10^{16}$ cm$^{-2}$ hydrogen while the propagation area utilizes $1\times10^{16}$ cm$^{-2}$ hydrogen, the total effective dose is $0.01*6\times10^{16}$ cm$^{-2}$+ $0.99*1\times10^{16}$ cm$^{-2}$ or $1.05\times10^{16}$ cm$^{-2}$. Reducing or eliminating the propagation dose will have a first order effect on the total dose requirement for this cleaving process.

Lowering of the dose in turn depends on (i) optimizing the effect of the implanted hydrogen to maximize its cleave guiding action and (ii) optimizing the cleave process by generating the right stress intensity conditions at the crack tip to keep the cleave front within the desired depth without breaking or cracking the film. Embodiments in accordance with the present invention are directed to optimizing the mechanical configuration during the cleave propagation process.

In one embodiment, the cleave initiation region can be created in a patterned implantation by irradiating high energy ionic particles with controlled dosage generated using a linear accelerator. In certain embodiments, the present invention provides a mechanical moment loading with a force loading (generated through an appropriate thermal treatment process and/or mechanical forces) to generate a stress gradient such that a substantially zero shear region can be formed despite the natural tendency of the mechanical configuration to generate mixed-mode loading. In other embodiments, the externally applied energies generate controlled mixed-mode loading conditions sufficient to allow propagation along a desired cleave plane.

Utilizing embodiments of the present invention, a high quality thick film crystalline material having a thickness ranging from a few tens of microns to a few hundreds of microns, can be produced with kerf loss substantially lower than possible utilizing conventional techniques. The resulting single crystal silicon thick films are particularly suited for use in high efficiency (20% or higher) photovoltaic cells. Some embodiments can utilize existing manufacture processing systems and techniques, and take some advantage of certain newly developed techniques for manufacturing thin wafer/substrate for various semiconductor device applications. More details about various embodiments of the present invention can be found in the description below.

BRIEF DESCRIPTION OF THE DRAWINGS

FIG. 3B shows simulation results of the stress of the film resulting from cleaving utilizing a constraint plate.

DETAILED DESCRIPTION OF THE INVENTION

Figure 1:
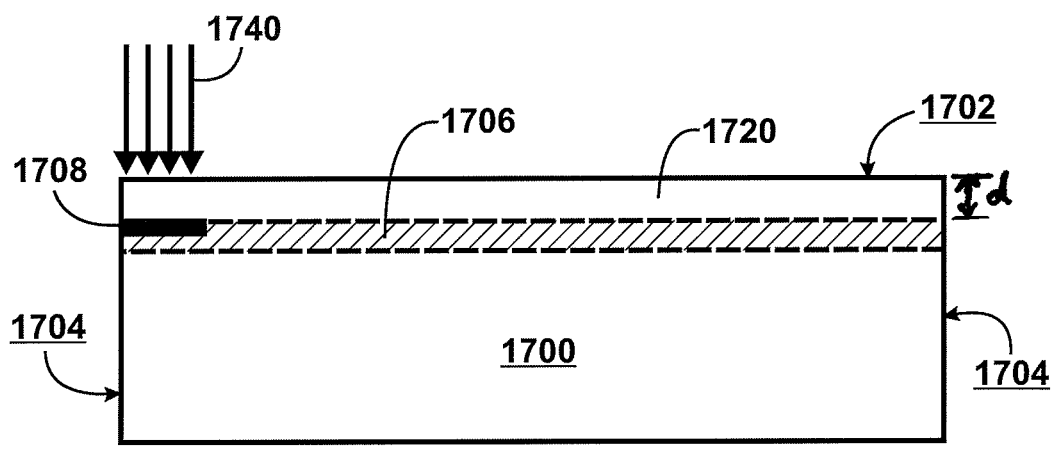
FIG. 1 shows a simplified schematic view of the general case of propagation.

Particular embodiments of the present invention provide a method and device for layer transfer of thick films for solar cells. Merely by example, it is applied to cleave thick films along a crystallographic plane of single crystal silicon substrate. But it will be recognized that the invention has a wider range of applicability. For example, other materials such as Germanium, Gallium Arsenide (GaAs), Gallium Nitride (GaN), or Silicon Carbide (SiC) could be subjected to the cleaving process to release films of materials for solar, opto-electronic or semiconductor applications.

As discussed in background section, the growth of silicon based solar cells relies on driving down a bottleneck for cost in wafering kerf-loss. Traditional sawing, or adopting recently reported wafering technologies (such as multi-wire saw, spark cutting, laser cutting, or plasma cutting) that render thick films suitable for solar cells, may exhibit limited usefulness due to one or more of the following issues: high kerf loss high, slow cutting speed, and lack of manufacturability.

A solution is to use a high energy ion beam to create a cleave region at a desired thickness beneath the substrate surface, then perform a layer transfer process to free the thickness of film from remaining substrate. However, use of only implanted ions to create a cleave region susceptible for cleaving, may require a high ion dose and an extended implanting area. Moreover, such reliance upon implanted ions may result in higher surface roughness, added cost with high ion dose and less productivity, and potentially lower yields. Depending upon the embodiment, these and other limitations are overcome using the present method and structures.

According to particular embodiments of the present invention, cleaving of a film of material may be accomplished with substantially reduced implantation of ions, or possibly no implantation at all, utilizing a cleaving process that carefully controls the shear conditions during the cleaving. In an embodiment, a film of material may be formed by providing a semiconductor substrate having a surface region, a peripheral region, and a cleave region at a predetermined depth beneath the surface region. For purposes of the instant patent application, the term "cleave region" does not necessarily denote a region that has received radiation or implanted ions, but rather refers to a region that may be separated from the substrate following the application of radiation and/or implanted ions and/or suitable external cleaving energies.

A cleave initiation region may be defined within a portion of the peripheral region and a vicinity of the cleave region. The cleave initiation region may be formed by subjecting the region to a thermal, chemical, electrical, and/or mechanical process to spall or release a section of the film within the initiation region.

In one embodiment, initiation cleaving is accomplished by subjecting the cleave initiation region to a localized thermal treatment, so that a cleave front can be initiated within this region and propagates to the periphery of the initiation region where the dose is lower and does not promote further propagation. The general film release process can then continue to propagate the initiated film from the existing cleave front through the remainder of the substrate.

FIG. 1 is a simplified diagram illustrating a side view of a semiconductor substrate having a cleave region at a predetermined depth beneath a surface region according to an embodiment of the present invention. This diagram is merely an example, which should not unduly limit the scope of the claims herein. One of ordinary skill in the art would recognize many variations, alternatives, and modifications.

As shown in FIG. 1, a semiconductor substrate 1700 is provided having a surface region 1702 and a peripheral region 1704. In addition, a cleave region 1706 is provided. This cleave region is in essence a virtual plane or layer located at a predetermined depth d beneath the surface region 1702, and is used to define a thickness of thick film 1720 to be detached from the semiconductor substrate 1700. In one embodiment, the semiconductor substrate has a thickness substantially larger than the depth d. In a specific embodiment, the semiconductor substrate is single crystal silicon material for use in a photovoltaic solar cell. In a specific embodiment, the silicon substrate has a surface plane that is selectively in a {111} or {110} crystallographic plane (a certain small miscut angle of less than about 1° or less than about 3° may exist). In a specific embodiment, the cleave region defined is substantially parallel to the surface region. Since the cleaving action is energetically easier along the {111} plane followed by {110} plane than in the traditional {100} plane, it is desirable to orient the material to be cleaved to coincide the surface to be cleaved with a lower surface energy crystallographic cleave plane. More detailed description of techniques for selecting certain orientation of the silicon boule for slicing or cleaving can be found in the U.S. Provisional Patent Application to Francois J. Henley titled "METHOD AND DEVICE FOR SLICING A SHAPED SILICON INGOT USING LAYER TRANSFER,", commonly assigned, and hereby incorporated by reference herein.

FIG. 1 also shows the formation of a cleave initiation region by pattern implanting high energy particles according to an embodiment of the present invention. This diagram is merely an example, which should not unduly limit the scope of the claims herein. One of ordinary skill in the art would recognize many variations, alternatives, and modifications.

As shown in FIG. 1, a portion of the peripheral region 1704 can be associated with a predetermined patterned region (not shown directly in the cross-sectional view of FIG. 1) within the surface region 1702. In one embodiment, the selected portion of the peripheral region is within an edge vicinity of the cleave region 1706.

Then the patterned region of the surface region 1702 is exposed to a high energy ion beam 1740, for example H+ ions with energy level of 1 MeV or more using a linear accelerator. In one embodiment, the area of the patterned initiation region is limited to 1-3% of the total substrate surface area (e.g., 2-5 $cm^2$ or less for a 125 mm×125 mm sized substrate), so that the ion particle dose is well controlled minimize energy costs of the system and enhance productivity of the thick film cleaving process.

The high energy ions are implanted beneath the surface region to reach a region within the vicinity of the cleave region 1706. The penetration depth of the ions is dependent on the energy level, and can be controlled to a desired value that determines a depth d of the cleave region. The implanted ions slow down within the crystal lattice by transferring kinetic energy to the lattice in the form of ionization (electronic braking), and small amount of atomic damage by displacing atoms (nuclear stopping).

During the final phase (about 2-5% of the total range), the ions interact substantially more with the crystal lattice under nuclear stopping, and a thin region of relatively high stress and damages lattice bonds is formed to define a cleave initiation region 1708. As shown, the formed cleave initiation region 1708 is a small planar region extending from a portion of the peripheral region 1704 toward within the cleave region 1706. Since the patterned implantation is performed by irradiating ionic particles within an area less than 1-3% of total area of surface region, this initiation dose can be higher than the propagation dose. This allows the averaged area dose to be maintained low for enhanced productivity. Of course, there can be many alternatives, variations, and modifications.

Substantially Zero Shear Region

Certain embodiments of the present invention seek to modify the cleaving configuration to reduce, eliminate, or control the shear mode II stress intensity factor (KII) at the tip of a propagating cleaving fracture. Under such conditions, the cleaving action is allowed to progress along the desired cleave plane.

While the condition KII=0 is an ideal condition for cleaving direction, there is a certain range of KII within which the cleaving will follow either a crystallographic cleave plane or a plane of hydrogen implant dosage. Thus, where conditions allow for maintenance of KII within a limited range around zero, the cleaving action can desirably continue to follow a cleave plane.

The following discussion address general Linear Elastic Fracture Mechanics (LEFM) equations that may govern cleaving according to embodiments of the present invention.

This analysis assumes a large-area tile, where the film is much thinner than the remainder of the silicon tile.

Figure 2:
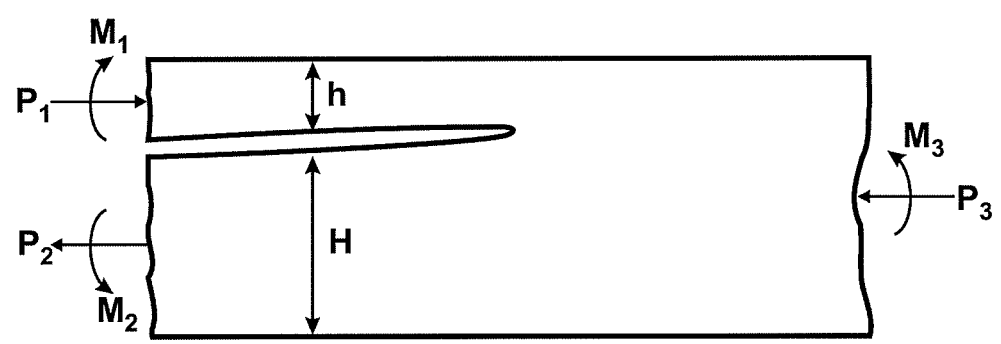
FIG. 2 is a simplified diagram showing a formation of a cleave initiation region by patterned implanting high energy particles according to an embodiment of the present invention.

The mechanical configuration following the initiation process is shown in FIG. 2. Specifically, a thick film of thickness h is partially released from the rest of the silicon ingot substrate having thickness H. Due to the much larger dimensions of the substrate relative to the cleaved material, h<<H and the tile moment and forces $M_2$, $P_2$ and $M_3$, $P_3$ are understood to be very small. The source of stress intensity seen at the crack tip is thus dominated by $M_1$ and $P_1$, the moment and force coupled to the partially released thick film.

A basic concept of embodiments of the present invention is the hydrogen cleave plane. The hydrogen cleave plane (H-plane) affects the cleaving action through stress and layer weakening effects. Specifically, the H-plane can be used both as an initiating layer at higher doses, and as a guiding or propagating layer when the dose is lower. The action of the H-layer is different within these two dosage regimes.

One effect upon cleaving action of the end-of-range (EOR) hydrogen implant layer, is the reduction in fracture strength around the cleave plane. Such reduction in fracture strength can be caused by bond damage and by stress induced by the presence of the hydrogen itself. Both of these considerations can lower the energy needed to create a new surface during cleaving.

The energy needed to create a new surface during cleaving, is hereafter referred to as the surface energy ($\gamma$). In unimplanted single crystal silicon, the surface energy is about 1.2 J/m² for the {111} orientation, although fracture toughness in silicon is sometimes reported as 4-6 J/m² and includes effects such as lattice trapping to give an effective energy to produce a new surface. For the following analysis of silicon at {111} orientation, a surface energy of 1.2 J/m² per surface (2.4 J/m² total) will be assumed.

By contrast, the value of the modified surface energy ($\gamma'$) along an implanted cleave plane can be substantially lower, perhaps by a factor of 5 or more. The surface energy value $\gamma'$ of the effective cleave plane is related to the unimplanted surface energy ($\gamma$) according to the following relation:

$$\gamma' = \alpha_H^2 * \gamma \quad (1)$$

where $\alpha_H$ is a factor between 0 and 1 that serves to quantify the reduction in cleave energy due to hydrogen embrittlement. The $\alpha_H$ term accounts for all of the effects necessary to yield an accurate representation of all of the stress and bond damage effects. $\alpha_H$ is experimentally determined as a function of cleave energy, dose, implant thermal conditions, and post-implant thermal conditions.

If the H-dose embrittlement effects are proportional to stress intensity, it may follow that cleave energy is related quadratically to dose as follows. For relatively low doses of less than about 3-4×10¹⁶ cm⁻²:

$$\alpha_H = 1/(1+k_H*\varphi) \quad (2)$$

where $k_H$ is a constant to be determined experimentally, and $\varphi$ is the hydrogen dose.

Substituting equation (2) into equation (1) yields:

$$\gamma' = [1/(1+kH*\varphi)]^2 * \gamma \quad (3)$$

Since the cleaving energy is a fundamental parameter in linear elastic fracture mechanics, the correlation between implant dose and energy allow accurate prediction and modeling of cleaving action.

Two surfaces are created during the cleaving process. Thus the cleave energy release rate (G') is related to the surface energy as follows:

$$G' = 2*\gamma' = 2*\alpha_H^2*\gamma \quad (4)$$

Depending on the embrittlement factor ($\alpha_H$), G' can change from about 2.4 J/m² to substantially less within the cleave plane. For example, in an experiment involving a 50 μm thick single crystal silicon film, a crack in a cleave plane formed by a H implantation dose of 2-8×10¹⁶ cm⁻² showed that for H-doses higher than about 4-6×10¹⁶ cm⁻², there is a measurable lowering of the cleave energy ($\alpha_H^2$<1) as measured by a double-cantilever beam mechanical configuration.

Lower cleave energy can have a guiding effect to keep the cleave plane within the weakened layer during propagation. This is because the energy barrier to branching from the cleave plane will be higher if $\alpha_H$ is lower. For example, a high dose implant may result in sufficient lowering of the cleave energy within the implant, that the film may simply peel off of the substrate.

For cleave planes with lower hydrogen doses (less than about 4×10¹⁶ cm⁻²), it has been experimentally determined that $\alpha_H^2 \sim 1$. With the cleave energy essentially having intrinsic cleave energy values, cleave guiding at lower doses is thus mostly dominated by the implanted hydrogen compressive stress profile that helps keep the cleave front propagating along the cleave plane. Specifically, a guiding effect is the shear force generated by the in-plane compressive layer that is generated when the cleave front moves away from the center of the compressive stress profile. Any deviation of the cleave front depth away from this center point of compressive stress, will tend to generate an in-plane (KII) shear force having a polarity that tries to maintain the cleave front propagating parallel to and within the cleave plane over a range of shear stress intensity values (non-zero KII). Thus, if the cleave front starts moving up to the surface, a positive ($K_{II}$) shear force will guide the cleave front lower towards the center. Conversely, if the cleave front starts moving lower into the tile, a negative $K_{II}$ shear force will guide the cleave front higher towards the center.

This phenomenon occurs because any non-zero KII generated during cleaving will tend to guide the fracture plane away from the cleave plane so as to minimize KII. This effect can be cancelled to some extent by the shear generated by the cleave layer that is generated in the opposite direction. The result is a net offset in cleave depth that becomes the new cleave depth where KII=0.

This slight movement of the cleave depth has been experimentally observed, and the maximum shear that the cleave layer can absorb is related to the compressive stress level present at the cleave plane and the straggle (Rp) of the implant defining the cleave plane. Once the shear stress level is higher than this critical level, the cleave front will jump out of the cleave plane and cleave failure will occur.

It is therefore a potentially important design consideration to have a cleaving configuration that minimizes the induced KII shear forces, in order to allow controlled cleaving at the desired depth with low propagation doses. The effect can be modeled by a capture range of KII stress intensities within which the cleave propagation direction continues to lie parallel and close to the KII ~0 fracture propagation plane.

The upper and lower limits of KII stress intensity factors where cleave direction control is lost, are defined as $\Delta_{KII-}$ and $\Delta_{KII+}$. These parameters are important to the design of the cleaving process, since low capture ranges would mean that the cleave plane can easily branch and cause cleave failure.

Determining the $\Delta_{KII-}$ and $\Delta_{KII+}$ factors as a function of dose and implant/anneal conditions are also relevant to the design of the cleaving system. An estimated $\Delta_{KII-}$ to keep the propagation with a mixity (KII/KI) of −0.779 (the mixed-mode stress intensity ratio of a film bending mode $M_1$ with no film stress $P_1$) for {111} silicon with $\alpha_H^2 \sim 1$, is about −0.18 MPa-m$^{1/2}$.

Cleave failure is essentially defined as the unwanted branching of the cleave plane, usually resulting in fractured films. Avoidance of unwanted branching of the cleave plane is thus a consideration in the design of cleaving techniques. Other factors found to affect unwanted branching include crystal orientation and implant dose and depth and temperature profile, for example.

Other effects have been found to be important. For example, for single-crystal silicon, thermal energy injected within the vicinity of the cleave plane and used to generate $P_1$ cleaving stresses, will be affected by the fact that the implanted cleave plane has a substantially lower thermal conductivity over unimplanted single-crystal silicon. This lower thermal conductivity is a result of the hydrogen implant damage and will tend to modify the temperature profile, which in turn will modify the cleaving stresses.

A series of closed-form equations have been developed to investigate cleaving behavior. Development of these equations assumes that a starter crack resulting from cleave initiation, is present at a depth of (h) into the substrate, thereby defining the thickness of the cleaved film. In many of the examples, h=50 μm, but any film thickness is allowed in the equations. The models assume a 5 mm detached film length (named c or sometimes L). The geometry is two-dimensional, meaning that the width w does not change as the cleaving occurs along a line.

The crack opening force mode (KI), and the in-plane shear force mode (KII), are important parameters for modeling the cleaving process. It would be expected that the resultant conditions leading to crack extension and propagation would match silicon or any other material if the known fracture energy for that cleaving configuration is utilized. For example, the fracture condition is known to occur in single crystal silicon when G' exceeds 2*γ', about 2.4 J/m$^2$ for an unimplanted layer.

The threshold for fracture propagation is defined as follows:

$$G = \frac{1}{E_1'}(K_I^2 + K_{II}^2)$$

where E'=the plane strain equation defined as E'=E/(1-v$^2$), and, for all purposes of this document, G is G' and generally related to the cleave plane by equation (4):

$$G' = 2*\gamma' = 2*\alpha_H^2*\gamma \tag{4}$$

FIG. 2 shows the general case of the propagation problem. Substituting equation (4) into equation (5) yields the following solution for KI and KII:

$$G' = \frac{1}{2E'}\left[\frac{P_1^2}{h} + 12\frac{M_1^2}{h^3} + \frac{P_2^2}{H} + 12\frac{M_2^2}{H^3} - \frac{P_3^2}{h+H} - 12\frac{M_3^2}{(h+H)^3}\right] \tag{6}$$

Where $P_n$ and $M_n$ are the forces and moments respectively, acting on each of the members.

The KI and KII factors then take the form:

$$K_I = \frac{P}{\sqrt{2hU}}\cos\omega + \frac{M}{\sqrt{2h^3V}}\sin(\omega+\gamma),$$

$$K_{II} = \frac{P}{\sqrt{2hU}}\sin\omega - \frac{M}{\sqrt{2h^3V}}\cos(\omega+\gamma). \tag{7, 8}$$

Where the parameters are derived from the forces, moments and geometry as described in detail by Hutchinson and Suo, "Mixed Mode Cracking in Layered Materials", Advances in Applied Mechanics, Vol. 29 (1992), which is incorporated by reference in its entirety herein for all purposes.

If the thickness of the remaining substrate (H) is assumed to be very large compared to the film thickness (h), the above equations (7, 8) can be simplified and collapsed into equations (9, 10) by the following:

γ (angle)=0
P=P1
M=M1
U=1
V=1/12
ω=52.07 degrees
η=h/H~0
All C constants are zero $$K_I = \frac{1}{\sqrt{2}}\left[Ph^{-1/2}\cos\omega + 2\sqrt{3}\,Mh^{-3/2}\sin\omega\right],$$

$$K_{II} = \frac{1}{\sqrt{2}}\left[Ph^{-1/2}\sin\omega - 2\sqrt{3}\,Mh^{-3/2}\cos\omega\right], \tag{9, 10}$$

Equations (9, 10) will be used to derive the various configurations of the cleaving approaches for the case where $M_2$, $P_2$ and $M_3$, $P_3$ are zero. The only change in the equation based on the configuration is to include the appropriate force (P) and moment (M) relationships for the particular loading conditions. The case where $M_2$, $P_2$ and $M_3$, $P_3$ are not zero is discussed later.

Cleave Configurations Leading to KII Cancellation

The general equations 9 and 10 show that forces and moments imparted to the film will generate KI and KII stress intensity factors at the crack tip as described in the equations. The film force P is the force per unit width imparted to the film and related to film stress at the crack tip area as P=σ*h. The moment is the moment impressed onto the film that generates M at the crack tip. That the M and P relation is additive in equation 9 but subtractive in equation 10, suggests that application of P and M can add in KI while subtracting in KII. Therefore, if the moment M and film stress force P are chosen correctly, the condition of simultaneously achieving crack extension while KII is cancelled (zero) would assure that the propagating crack has the greatest tendency to propagate along the cleave plane. This optimized set of conditions would allow low or zero dose cleave plane operation, and even allow controlled depth guiding through active control of M and P as a function of the actual cleave depth achieved during crack extension. Such reduced or no dose conditions, and control over the depth of cleaving are among the significant benefits achieved according to embodiments of the present invention.

Coordinate System Used in the Models

To quantify the various configurations, a coordinate system was defined with the cleave plane along the X direction (positive X to the right), the thickness of the film along the Y-direction (positive in the up direction), and the Z direction is positive out of the surface. This coordinate system is used in the Finite Element Analysis (FEA) code. Software available from Ansys, Inc. of Canonsburg, Pa. (hereafter the AnSys software) was used to model the crack propagation system and included thermal and mechanical parts that interacted with a cohesive zone model (CZM) of the interface. The CZM code allowed the determination of conditions under which the applied stresses and moments would propagate the fracture.

The configuration of FIG. 2, where the detached, initiated film is to the left, was entered into the AnSys software. The results are summarized in the following sections and show the KII cancellation action resulting from different loading (P and M) configurations.

Moment Application Conditions

The moment applied to the film was a bending of the film away from the rest of the substrate. Such bending will generate KI and KII conditions that tend to break the film. If a pure moment (P=0) is used, the KI and KII will change depending on the moment value, but will have a constant ratio (KII/KI) of $-\cos(\omega)/\sin(\omega)$ or $-0.78$ since $\omega$ is unchanging with a value of 52.07 degrees. This ratio is defined as the mixity of the stress intensity, and its value determines the tendency for the propagating front to change in thickness (the Y-direction). The moment application is therefore negative in mixity (snapping the film), and proportional to the bending of the film as experienced by the crack tip.

There are stable, metastable, and unstable methods of applying moments to a film. The major configurations are summarized below.

Constant Displacement Loading

A constant displacement applied to a film at a certain distance away from the crack tip is considered a stable loading configuration, since any crack extension will reduce the applied moment. The displacement is increased to reload the crack tip and the propagation process can resume. A blade or other means of developing a fixed distance in both X and Y at a point beneath the pre-cleaved film would develop a constant displacement load.

Constant Force Loading:

A constant force applied to a film at a certain distance away from the crack tip is considered an unstable loading configuration since any crack extension will increase the applied moment. This will usually result in uncontrolled crack extension and thus is not a preferred loading configuration.

Constant Moment Loading

A constant moment loading on a film can be developed using certain configurations as described here. One advantage of this configuration is the ability of the system to stay to a desired moment loading without active assistance. If a crack extension occurs with an application of a second load, for example, the system will continue being loaded with the same moment. This configuration is to be avoided if the moment is chosen to exceed the fracture strength of the material, since uncontrolled crack extension can occur.

The film bending moment can be applied either statically or quasi-statically or in a dynamic manner such as exciting the film ultrasonically in resonance or out of resonance. In all cases, the moment loading M imparted to the crack tip, according to certain embodiments of this invention, is designed to increase the KI and KII stress intensity factors using ultrasonic motion, displacements, and forces to a design point to allow controlled crack propagation along a desired cleave plane.

If the guiding of the cleave plane is sufficient (high $\Delta_{K_{II-}}$ and $\Delta_{K_{II+}}$), then there would be no reason to add P to the configuration and a threshold crack extension along the desired cleave plane is possible. This would occur if the $\Delta_{K_{II-}}$ and $\Delta_{K_{II+}}$ are sufficiently high to counter the inherent KII/KI mixity of $-0.78$ of this moment loading configuration. This does not occur naturally in silicon but with an optimized cleave plane, this may be a sufficient loading configuration to accomplish film detachment.

Constant Moment Loading Example Using Pressure and a Constraint Plate

According to particular embodiments, a plate positioned over the substrate may be utilized to constrain movement of the film separated during the cleaving process. In particular, the presence of the constraint plate may serve to reduce the in-plane shear mode component (KII) during cleaving when a second loading is used.

Figure 3A:
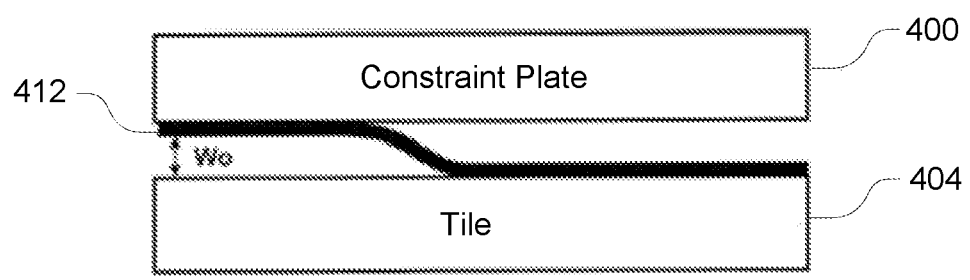
FIG. 3A shows a simplified cross-sectional view of an apparatus for cleaving including a constraint plate.

In certain embodiments, a constraint plate according to the present invention may be employed in combination with a source of pressure applied from the side, to accomplish cleaving of a film from a substrate. FIG. 3A shows a simplified schematic view of such an embodiment of the present invention.

Specifically, constraint plate 400 is disposed over a front surface of a substrate or tile 404 having its back surface supported on a tray not shown. Constraint plate 400 is separated from the underlying substrate or tile 404 by a distance Wo. Application of pressure (for example from a gas jet) to the side of the substrate 404, results in the pre-detached film 412 being pushed away from the remaining substrate and imparting a constant moment load. During this process, movement of film 412 is constrained by the presence of the plate 400.

FIG. 3B shows simulation results of the stress of the film resulting from cleaving utilizing such a constraint plate according to an embodiment of the present invention. The picture in FIG. 3B shows a pre-detached film of length 5 mm and thickness of 50 um moved (exaggerated) up and against the constraint plate using a few psi of pressure. The pressure moves the film towards a constraining plate situated above the surface. Here, a separation (Wo) of 50 um is used in the modeling.

An advantage offered by the configuration of FIG. 3A is its simplicity and the relative ease of generating the stresses necessary to propagate the fracture. The use of the constraint plate confers the benefit that no blade is needed to perform the cleaving. Alternatively, if a constraint plate is used in combination with a form of displacement cleaving (for example, a blade), the frictional forces on the blade can be reduced to arbitrarily low values.

An embodiment of a constraint plate in accordance with the present invention can utilize a force such as a vacuum force or an electrostatic force to attract and hold the cleaved film. In a particular embodiment, the constraint plate can be porous, such that a positive pressure can be supplied to create an air bearing surface supporting the attracted cleaved film thereby allowing translation of the substrate/constraint plate relative to one another as the cleaving proceeds across the substrate.

An issue with the configuration of FIG. 3A (as with the other moment loading configurations) is its high negative KII mixity. This can tend to snap the film.

In this configuration, P and M of equations (9, 10) are as follows:

P=0 (no stress is imparted on the film in the X direction)

$$M = p \cdot c^2/(4 \cdot k) \tag{11}$$

Where M is a moment per width, and thus has the dimension of force, rather than force*distance. p is the pressure differential imparted below the film, and c is the distance between the point where the film separates from the constraint plate to the crack tip.

Factor k of equation (11) is a parameter that may change depending on the friction between the constraint plate and the film. As will be shown, many of the basic elements of embodiments of the present invention are independent of k.

Different pressure loading configurations have a corresponding k that can be calculated. An unconstrained film (no top plate) will have k=1/2, while a circular blister will have k=2. Using a constraint plate, k is dependent on the method in which the film is being secured onto the constraint plate. Assuming that the film is constrained only in the Y (vertical) direction and frictionless, simulation with the AnSys software shows the k factor to be about sqrt(2) and therefore this will be used in the derivation of the equations. In the KII=0 relationships, the k factor does not play a role, and thus any error caused by a different k factor from 1 to 1.5 is considered small.

The KI and KII equations (9, 10) are thus transformed into equations (12, 13):

$$KI = 6^{1/2} \cdot p \cdot c^2 \cdot \sin(\omega)/(4 \cdot k \cdot h^{3/2}) \tag{12}$$

$$KII = -6^{1/2} \cdot p \cdot c^2 \cdot \cos(\omega)/(4 \cdot k \cdot h^{3/2}) \tag{13}$$

Again, the KII/KI mixity will be independent of pressure and thus the film will tend to snap off with reasonable geometries due to the highly negative KII.

The pressure p at which the crack will extend is:

$$p = [16 \cdot k^2 \cdot E'^* \cdot \gamma'^* \cdot h^3/(3 \cdot c^4)]^{1/2} \tag{14}$$

Assuming k=sqrt(2), unimplanted silicon, c=3.3 mm (the crack length that experiences the pressure p), and h=50 um, the critical pressure p is about 52 kPa, about 0.5 atmospheres of gauge pressure.

Simulation runs with the AnSys software have confirmed that cleave propagation occurs at a about 51 kPa using the parameters above. The equations are therefore considered fairly accurate for modeling stress intensity factors and predicting the onset of crack extension.

The AnSys software was also used to extract the Mode I (crack opening) and Mode II (in-plane shear) cleave energies, designated herein D1 and D2 respectively. Specifically, these cleave energies are extracted at the time of CZM debonding (cleaving). This extracted data can show the efficacy of the KII cancellation approaches.

To test the AnSys software, displacement and shear cleaving loads were used to compare with the closed form solutions of M-only and P-only cleave configurations. In all models, the cleave energy is 2.4 J/m², Young's Modulus is 187 GPa, the thermal expansion coefficient is 2.5 ppm, and Poisson's Ratio is 0.272.

Figure 4:
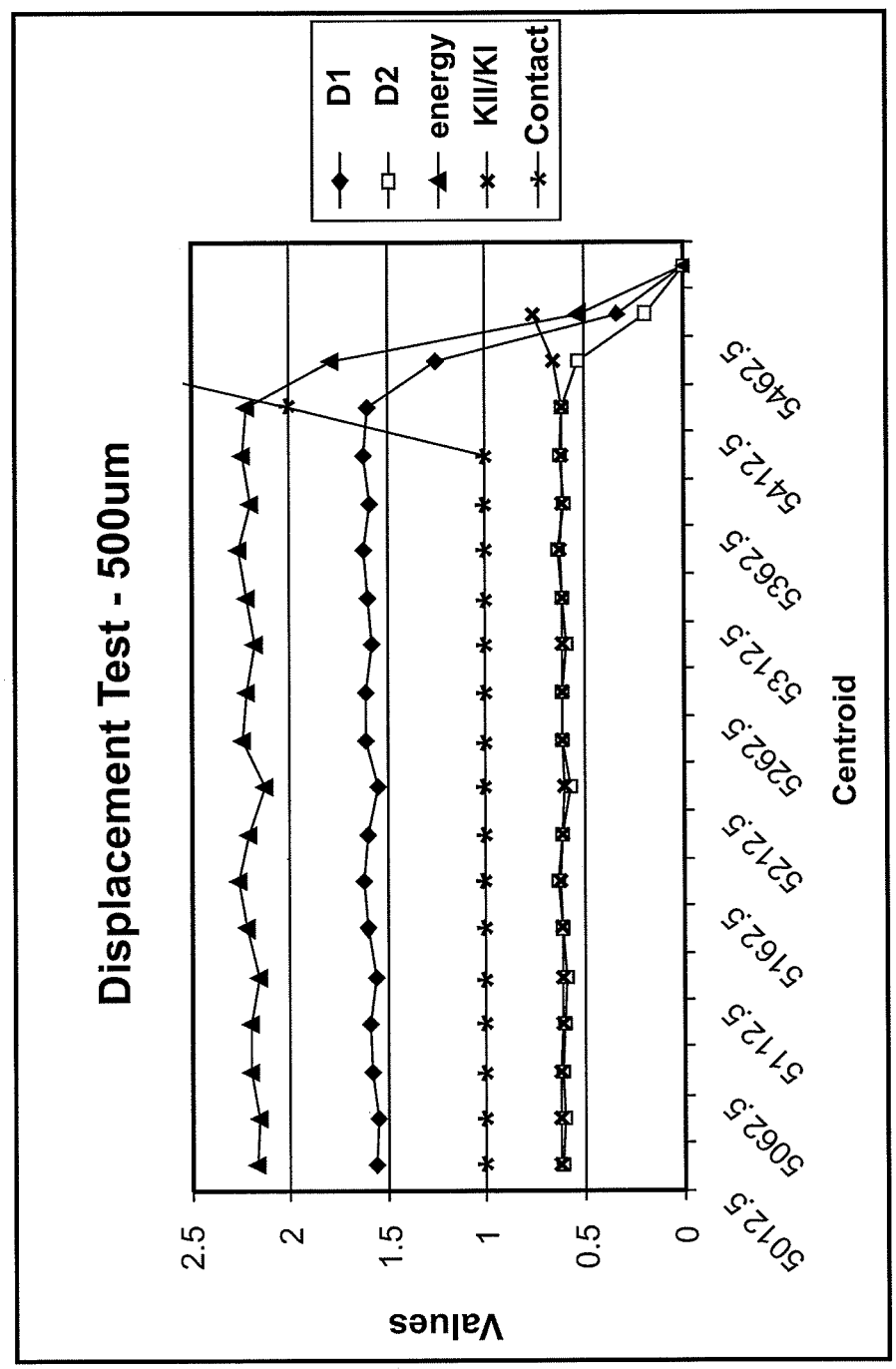
FIG. 4 plots for use of film displacement loading, several values as a function of distance (in μm) of the centroid of the cleaved zone from the tab edge of the substrate during crack propagation.

In the moment-only test, a 500 um displacement of the 5 mm film was used to measure the cleave energies D1 and D2. FIG. 3 plots several values as a function of distance (in µm) of the centroid of the cleaved zone from the tab edge of the substrate. FIG. 4 shows a mixity of about 0.6, and total cleave energy (D1+D2) of about 2.2 J/m². This slightly lower value of the mixity as compared with the expected value of 0.78, is a result of the thin bottom silicon used in the model. As the bottom silicon thickness is increased, mixity rises asymptotically to the 0.78 value.

Figure 5:
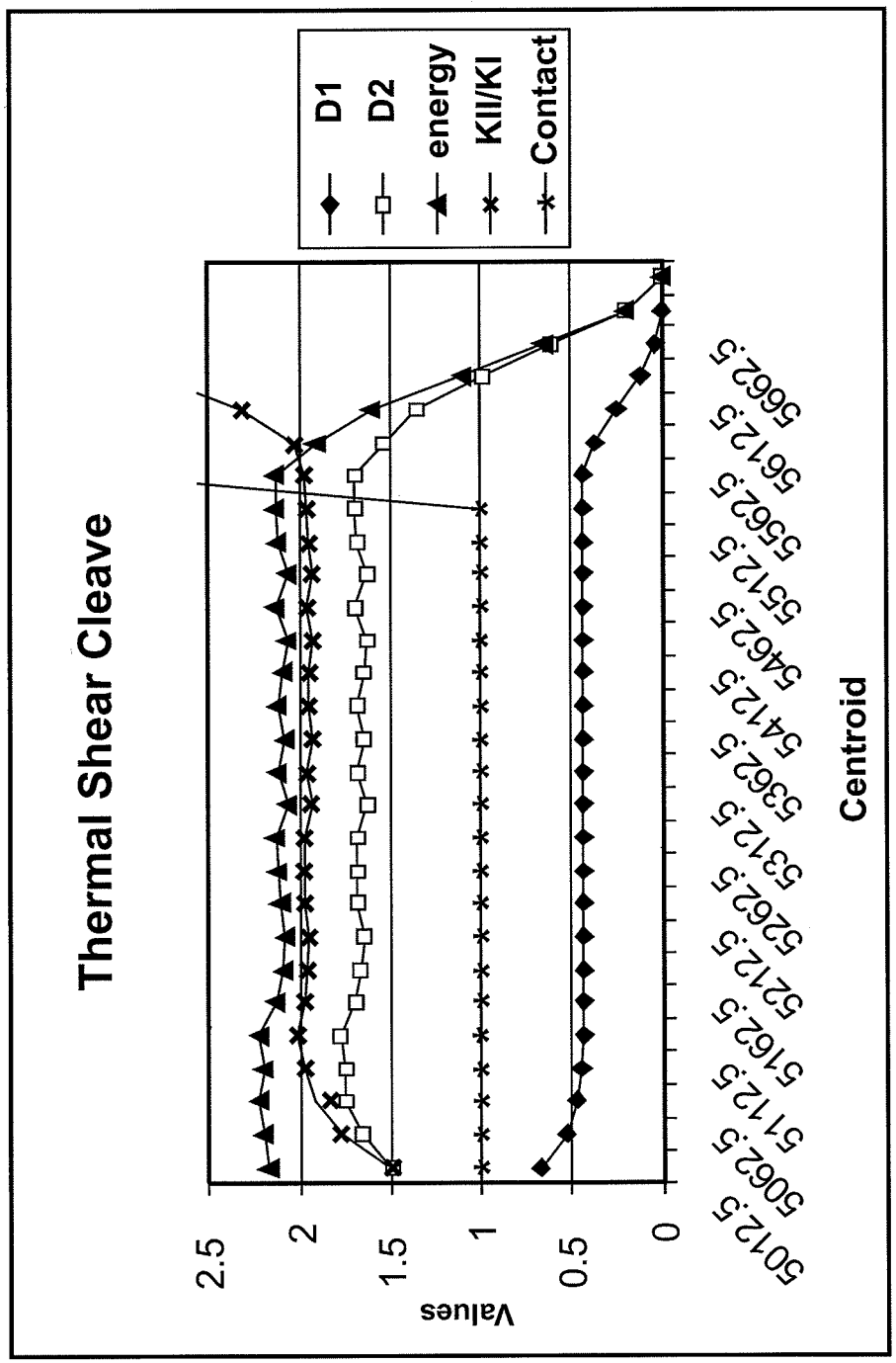
FIG. 5 plots for thermal shear, several values as a function of distance (in μm) of the centroid of the zone from the tab edge of the substrate during crack propagation.

In the P-only test, thermal shear cleaving measured the cleave energies D1 and D2. FIG. 4 plots several values as a function of distance (in µm) of the centroid of the zone from the tab edge of the substrate. FIG. 5 shows a mixity of about 2, and cleave energy of about 2.2 J/m². This slightly lower value of the mixity as compared with the expected value of 2.2 for pure shear cleaving, is a result of the thin bottom silicon used in the model. As the bottom silicon thickness is increased, mixity rises asymptotically to the 2.2 value.

Cleaving Propagation by Displacement Loading

According to certain embodiments, cleaving can be initiated by displacement loading—pulling on the film during cleaving to a specific distance in a direction away from the substrate surface. An example of such a cleaving approach utilizes insertion of a blade to pull the film away from the substrate during cleaving. In such embodiments P=0 and M=Fw*c, where Fw is the force per unit width (into the paper) and c is the crack distance in from the crack tip in which the load is applied.

Under these loading parameters, the KI and KII equations are:

$$KI = 6^{1/2} \cdot Fw \cdot c \cdot \sin(\omega)/h^{3/2} \tag{15}$$

$$KII = -6^{1/2} \cdot Fw \cdot c \cdot \cos(\omega)/h^{3/2} \tag{16}$$

The force necessary to cleave is related to γ' by the following:

$$Fw = [E'^* \cdot h_3 \cdot \gamma'/(3 \cdot c^2)]^{1/2} \tag{17}$$

A negative KII means that the crack will tend to deflect upward, snapping off the film during attempts to bend the film upwards using this configuration.

In one experiment, a relatively thick blade of 50 um (a piece of a cleaved silicon film) was able to extend a crack when pushed under the partially cleaved film. This experiment involved an implant dose level of on the order of 2-3×10¹⁶ cm⁻². A 2 mm extension was observed, but the inserted piece ended up binding to the film, and was not able to be moved thereafter. Since the binding is very sensitive to surface friction, blade thickness and other parameters, this technique may work but it would do so without the benefit of achieving KII=0. In other words, without KII cancellation, a blade or other form of displacement cleaving will rely to a greater extent on a weaker cleave plane or cleave plane compressive stresses to compensate for the non-zero KII in this configuration.

A thin diamond like carbon (DLC) coated blade used with an ultrasonic approach to breaking static friction/binding, could allow the blade technique to be used. Acoustic energy is applied through the mechanical blade and delivered to the tip region as the tip region is pushed inward along the already cleaved or initiated region. In one embodiment, the acoustic energy can be generated using an ultrasonic energy source or a megasonic energy source that operably couples to the mechanical blade. The acoustic energy reaching the tip region may cause ultrasonic excitation of the semiconductor substrate material at the cleave front or the vicinity of the tip region. Such ultrasonic excitation effectively accelerates the bond breaking process as the tip region pushes the cleave front forward. Therefore, with the assistance of applying acoustic energy the cleaving action can be much more efficient and productive. The lifetime for the mechanical blade can also be enhanced, resulting in further cost savings. Use of a pressure assist could also reduce the binding forces on a blade approach.

Film Stress Application Conditions (P-Loading)

In certain instances, moment-only loading is insufficient to allow reliable film cleaving through large areas, and the reduction of the KII shear stress intensity factor is necessary. There are different methods of imparting the film stress to the crack tip such that the KII is reduced or cancelled. The thermal methods will be developed here other methods are possible such as ultrasonic energy application in the shear mode or through the mechanical development of a force along the film (X-direction).

Based on the negative mixity from the moment loading, the thermal loading $\Delta T$ must of the correct sign to cause KI to increase and KII to decrease. Equations 9 and 10 show that this will occur if (i) a rapid cooling is imparted ahead of the crack (within the film thickness still attached), alone or in combination with (ii) a dynamic heating on the detached film behind the crack tip. These configurations appear identical, as pulling on the crack tip area through the film ahead of the crack tip, is equivalent to pushing on the crack tip area through the film behind the crack tip.

Both configurations will develop a load (P) with the correct sign, but the difference between the film being attached in front or detached in back of the crack tip will cause a significant difference in the methods employed to apply the loading. Here, P is the force per unit width along a film, while lower-case (p) is the pressure behind the film in the constant moment loading configuration.

Cleaving Utilizing Thermal Shock

According to certain embodiments, cleaving may be achieved through the action of stress within the film layer caused by thermal differences. In particular, exposure of the substrate to a cooling (cold shock) may result in cleaving of the film. If the cooling amount is difficult from a lower temperature, a relatively long period of heating (heat soak) prior to the application of the cold shock may help increase the thermal contrast. Alternatively, shock heating of the film behind the crack tip will generate the stresses necessary to advance the crack under certain conditions. Both P-loading configurations are summarized in greater detail later in this section.

The conditions for thermally induced film stress, combine into the KI and KII equations as follows:

$$M=0$$

$$P=\sigma_{th}*h$$

Recognizing that a thermal stress function of magnitude $\alpha_{CTE}*E*\Delta T$ is developed by a temperature change in a material with a coefficient of thermal expansion $\alpha_{CTE}$, the equation becomes, $$P=\alpha_{CTE}*E*h*\Delta T \quad (19)$$

Where $\Delta T$ is the temperature difference between the film being subjected to thermal treatment and connected material.

Substituting the thermally induced stress into equations (9 and 10) yields the following equations for KI and KII:

$$KI=\alpha_{CTE}*E*h^{1/2}*\Delta T* \cos(\omega)/\mathrm{sqrt}(2) \quad (20)$$

$$KII=\alpha_{CTE}*E*h^{1/2}*\Delta T*\sin(\omega)/\mathrm{sqrt}(2) \quad (21)$$

Note that a negative sign does not precede KII.

The thermal only cleave energy equation can be derived as:

$$G'=2*\gamma'=1/2*\alpha_{CTE}^2*E*h*\Delta T^2*(1-v^2) \quad (22)$$

According to certain embodiments of the present invention, the action of the positive thermal KII and the negative moment KII can be combined, to yield a cleave propagation technique that allows simultaneous achievement of the conditions of $G'=2*\gamma'$ (or any appropriate threshold cleave energy condition) and KII=0.

Pressure Loading (Constant M) with Cold Shock (Uncleaved Film Cold Shock Loading)

In this embodiment example, using:

$$P=\alpha_{CTE}*E*h*\Delta T\text{(thermal sink from film to substrate ahead }pf\text{ the crack }tip) \quad (23)$$

$$M=p*c^2/(4*k)\text{(constant moment loading with }a\text{ pressure source and constraint plate)} \quad (24)$$

The equation for KI and KII become:

$$KI=\alpha_{CTE}*E*h^{1/2}*\Delta T*\cos(\omega)/\mathrm{sqrt}(2)+\mathrm{sqrt}(6)*p*c^2*\sin(\omega)/(4*k*h^{3/2}) \quad (25)$$

$$KII=\alpha_{CTE}*E*h^{1/2}*\Delta T*\sin(\omega)/\mathrm{sqrt}(2)-\mathrm{sqrt}(6)*p*c^2*\cos(\omega)/(4*k*h^{3/2}) \quad (26)$$

Solving for these equations to simultaneously satisfy the two conditions (i) $G'=2*\gamma'$, and (ii) KII=0, couples the temperature difference to the pressure in the following manner:

$$\alpha_{CTE}*E*h^2*\Delta T*\sin(\omega)/\mathrm{sqrt}(2)=6^{1/2}*p*c^2*\cos(\omega)/(4*k) \quad (27)$$

With the second condition of $2*\gamma'=KI^2/E'$, the critical controlled cleave conditions can be calculated as:

$$\Delta T\mathrm{crit}=[2*\gamma'/(\alpha_{CTE}^2*E*h*(1-v^2)*1.323)]^{1/2} \quad (28)$$

And the critical pressure to be selected to assure these conditions is:

$$p_{crit}=4*\alpha_{CTE}*\Delta T_{crit}*E*h^2*\sin(\omega)/(6^{1/2}*c^2*\cos(\omega)) \quad (29)$$

For the case where the distance (Wo) between the constraint plate and the substrate surface is 50 µm, $p_{crit}$ is about 41 kPa lower than the pressure-only cleave of about 50 kPa. The critical temperature load is $-183°$ C. (cooling).

The KII cancellation condition can be understood as follows for a 50 um silicon film and a constraint plate placed 50 um above the surface. In one approach, the pressure loading of 41 kPa is applied to the film causes the film to bend and exert a moment of about 0.0808 N-m onto the crack tip.

A thermal cooling of $-183°$ C. is applied close to the crack tip on the uncleaved side. As the thermal loading is applied, the KII is reduced while KI simultaneously increases until the fracture energy condition is reached and the crack extends. Since the extension also occurs at the conditions KII=0, the crack will extend along the cleave plane with little or no net tendency to move away from the cleave plane.

If the thermal loading is exceeded, the additional energy has little or no effect to change the KII=0 condition since the crack will extend at very high speeds, about 20-40% of the speed of sound in the material. For silicon this is about 1.5 mm/usec to about 4 mm/usec. Any additional energy would just cool an already cleaved film material.

Figure 6A:
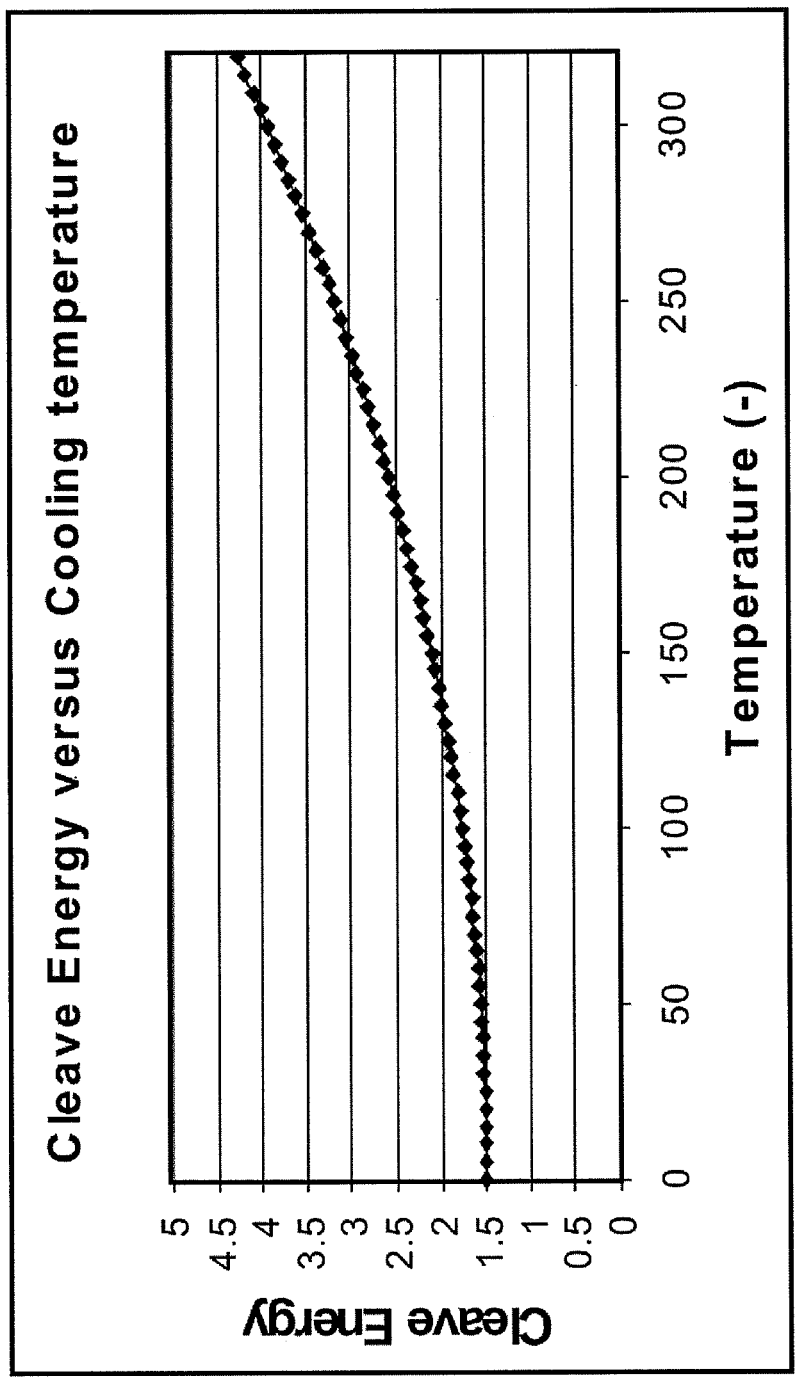
FIG. 6A plots cleave energy versus temperature differential at an applied pressure of 42 kPa.
Figure 6B:
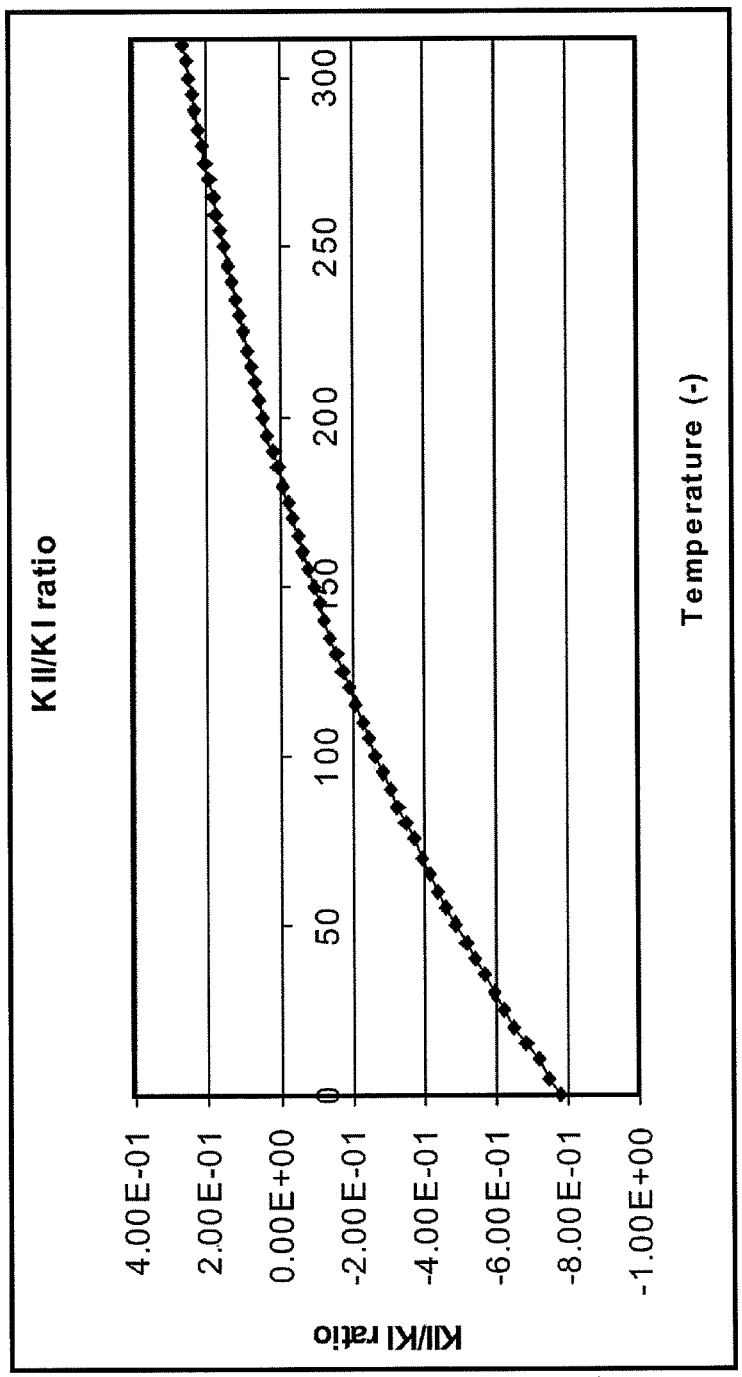
FIG. 6B plots KII/KI ratio versus temperature differential at the applied pressure of 42 kPa.

FIG. 6A plots cleave energy versus temperature for differential at an applied pressure of 42 kPa. FIG. 6B plots KII/KI ratio versus temperature differential at this same applied pressure.

The combined pressure/thermal cleaving model was modeled using the AnSys software and exhibited the expected functionality. Specifically, assuming an unimplanted silicon layer as a worst case, an AnSys software model has been run with the following parameters:

Wo=50 µm constraint plate
length of initiated cleaved film=5 mm
h=50 µm
The use of thermal heating and cooling sources was assumed.

This particular cleaving approach was modeled as a two-dimensional static structural analysis with static pressure and transient thermal temperature profiles as input loads. It was observed that the ΔT thermal loading required for KII=0 cleave propagation, was −183° C., very close to the expected closed-form solution.

To achieve the relatively large cooling transient, a combination of a heat soak (2 msec heating to 300° C.) followed by a 30 usec cooling transient was used to develop the desired thermal loading.

Figure 7:
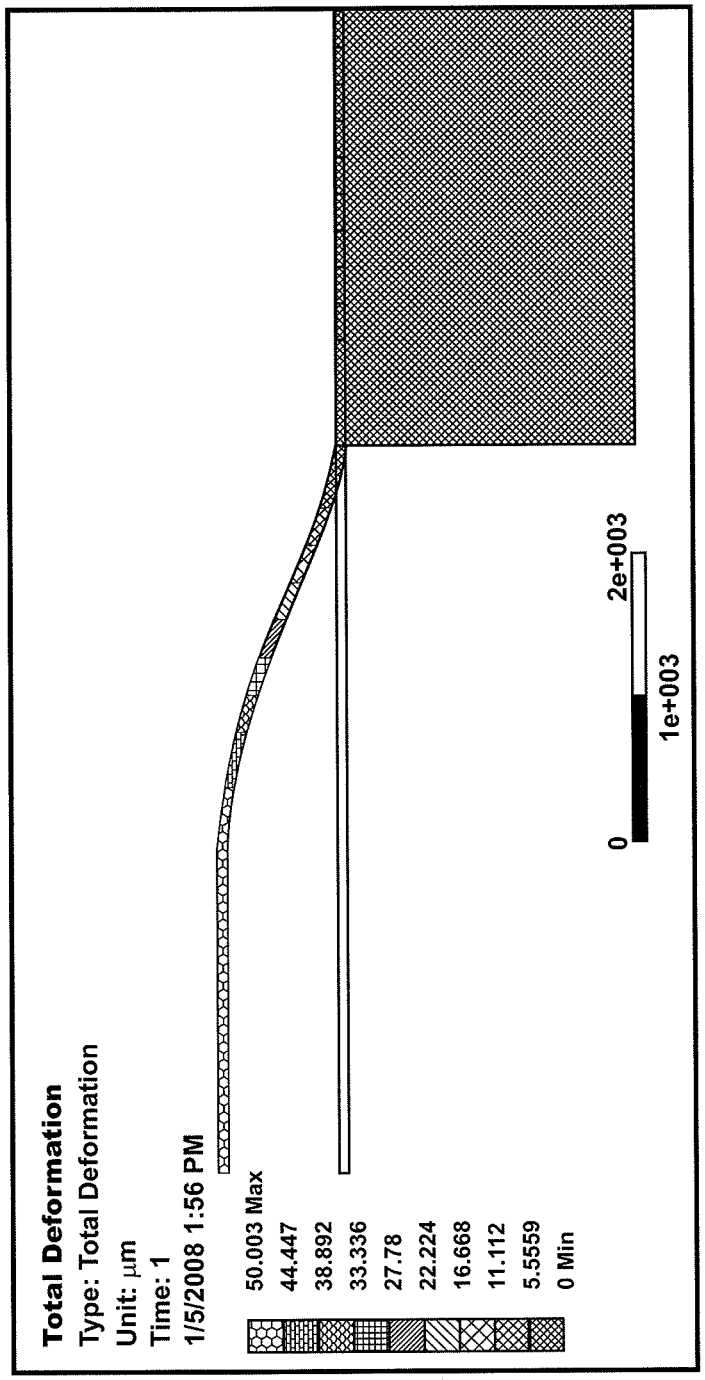
FIG. 7 shows the fully loaded pressure just prior to thermal loading and crack propagation.

Without any heating source, the KII/KI mixity can be as high as −0.779. The pressure is set at the expected 42 kPa as calculated from the model. With application of the full temperature load and the pressure (about 6 PSI) from the applied jet of gas, the initiated film is pushed up against the constraint plate and develops an effective length (c) of 3.3-3.5 mm down to the uninitiated film. FIG. 7 shows the fully loaded pressure just prior to thermal loading.

To avoid the heating transient from causing G' to meet or exceed the cleave fracture energy, a long thermal heating soak was used. This long soak maintained a low temperature differential between the top and bottom of the cleave plane during the heating cycle. A soaking time of 2 msec was assumed with a top temperature of 300° C. The resultant thermal profile at the end of the 2 msec soaking time for the first zone is shown in FIG. 8A.

Figure 8A:
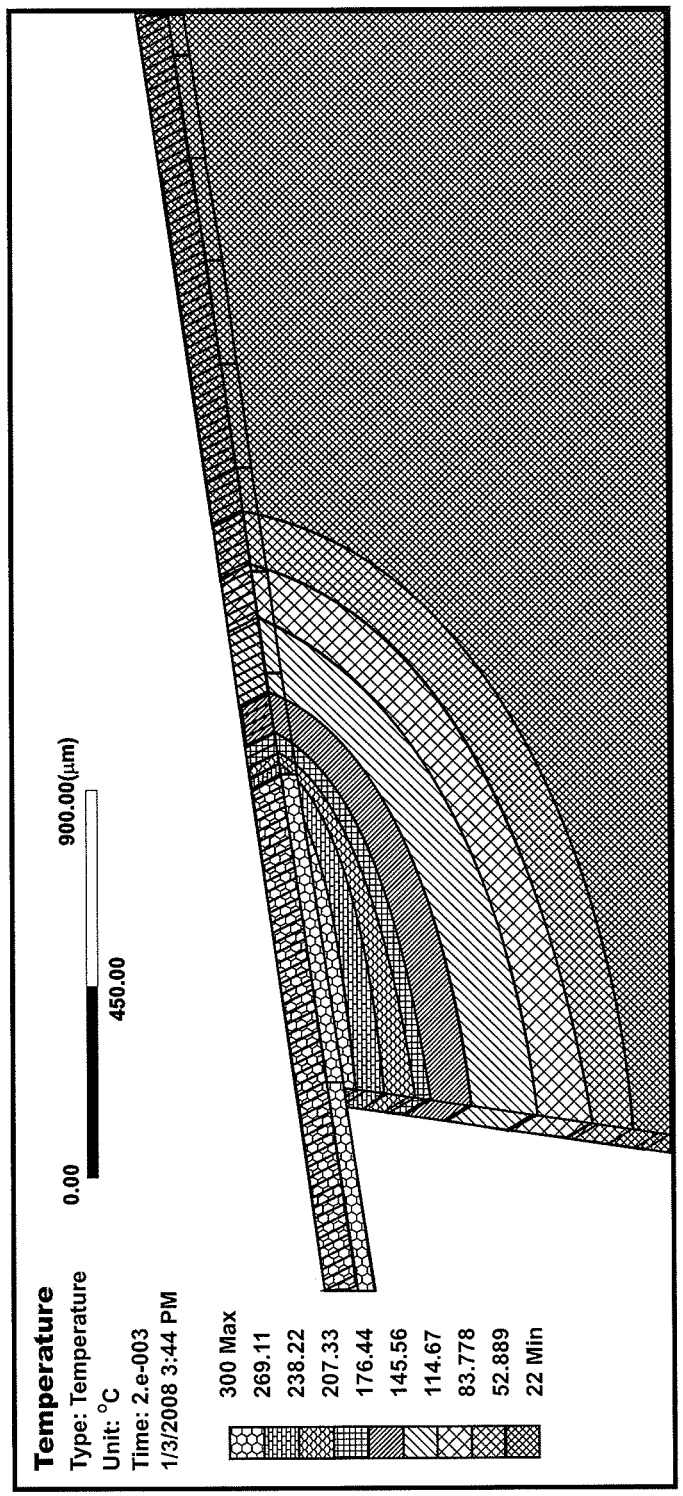
FIG. 8A shows the resultant thermal profile at the end of the heat soak.

The thermal profile of FIG. 8A clearly shows a fairly constant vertical profile through the film. Because of the relatively slow temperature ramp relative to the thermal time constant of the film of about 30 usec, insufficient KI and KII components are developed within the fracture plane and the film crack does not extend.

Figure 8B:
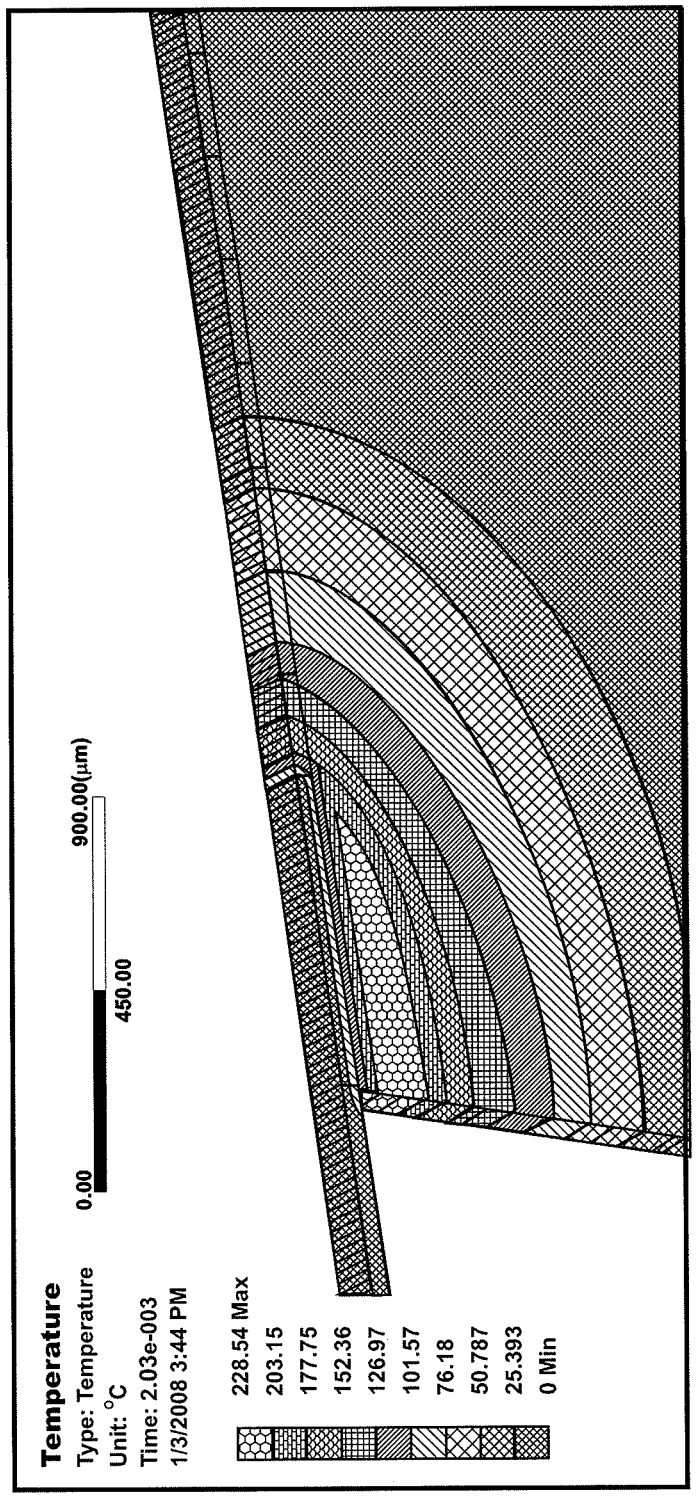
FIG. 8B shows the resultant thermal profile at the end of the cool shock.
Figure 9A:
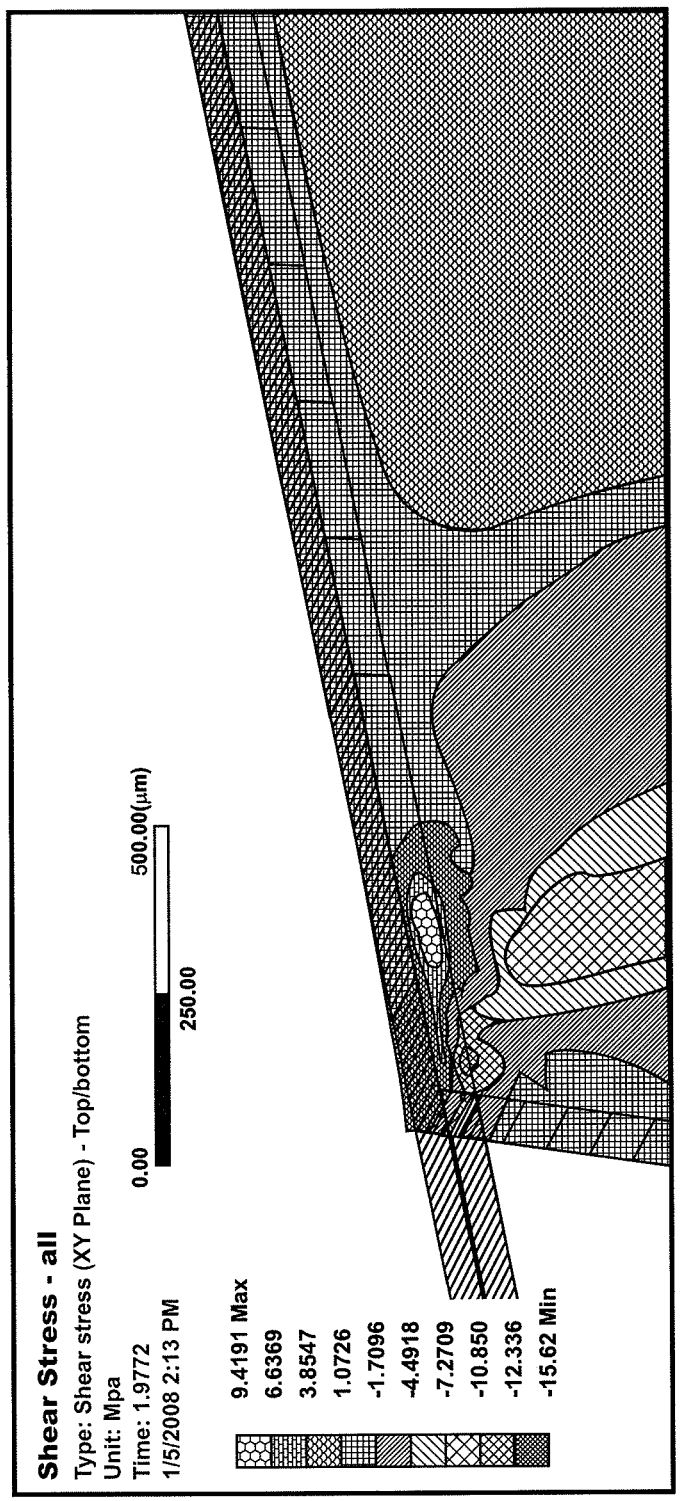
FIGS. 9A-D shows the heating/cooling cleaving sequence for cleaving three zones and the crack propagation time sequence following the application of pressure.
Figure 9B:
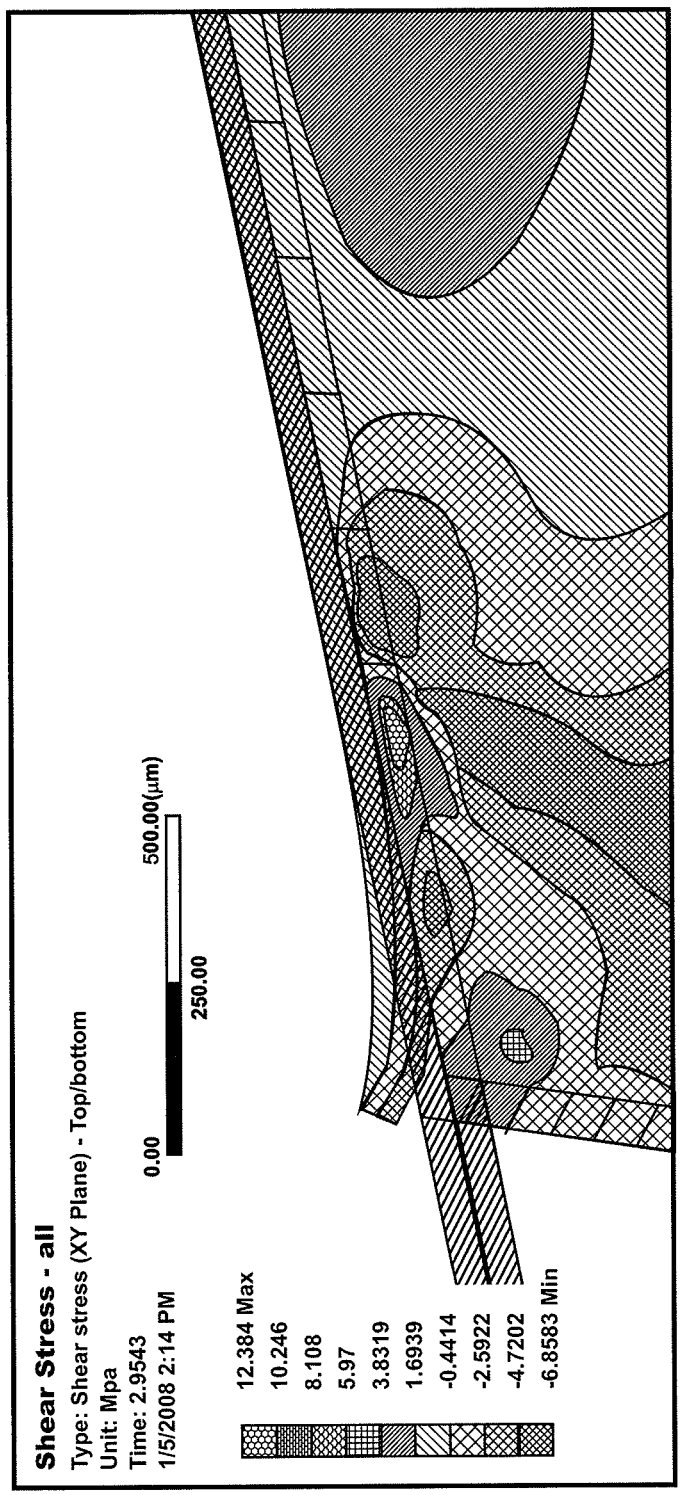
Figure 9C:
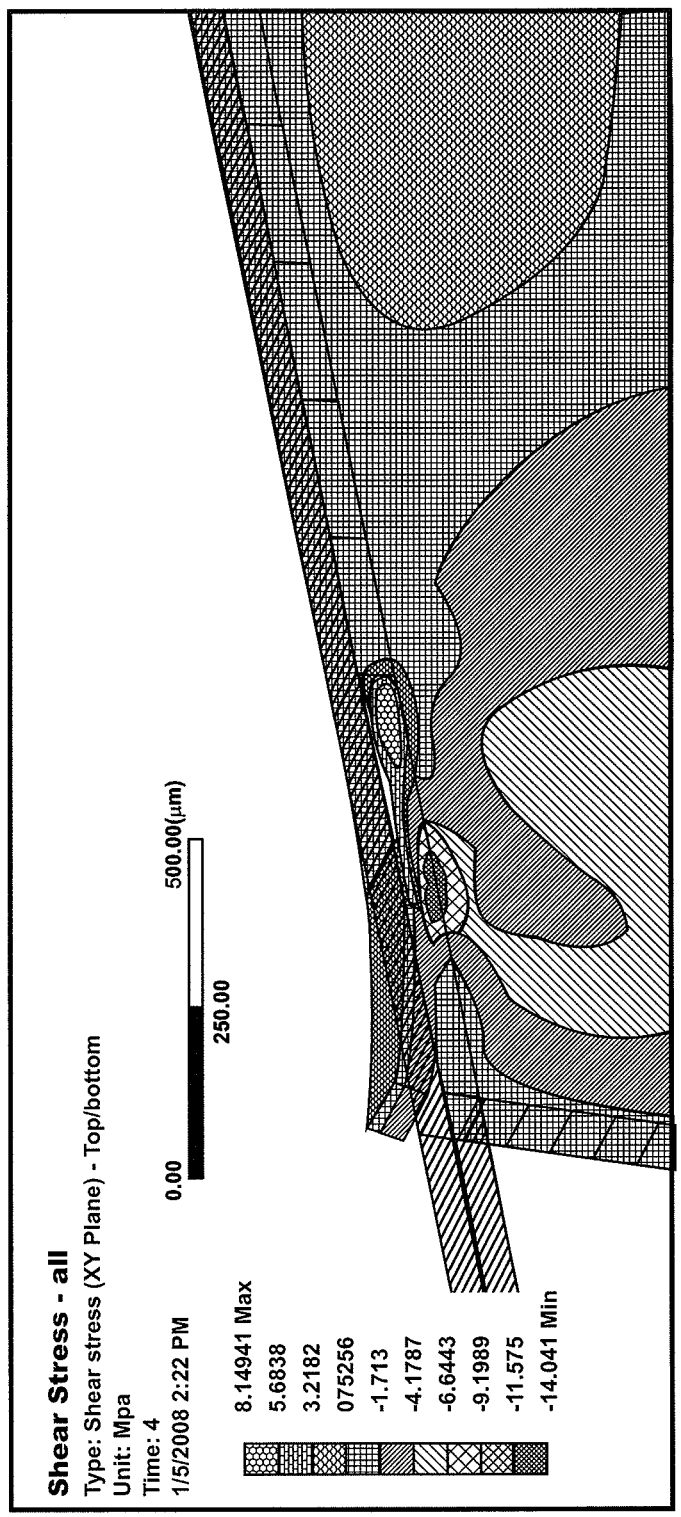
Figure 9D:
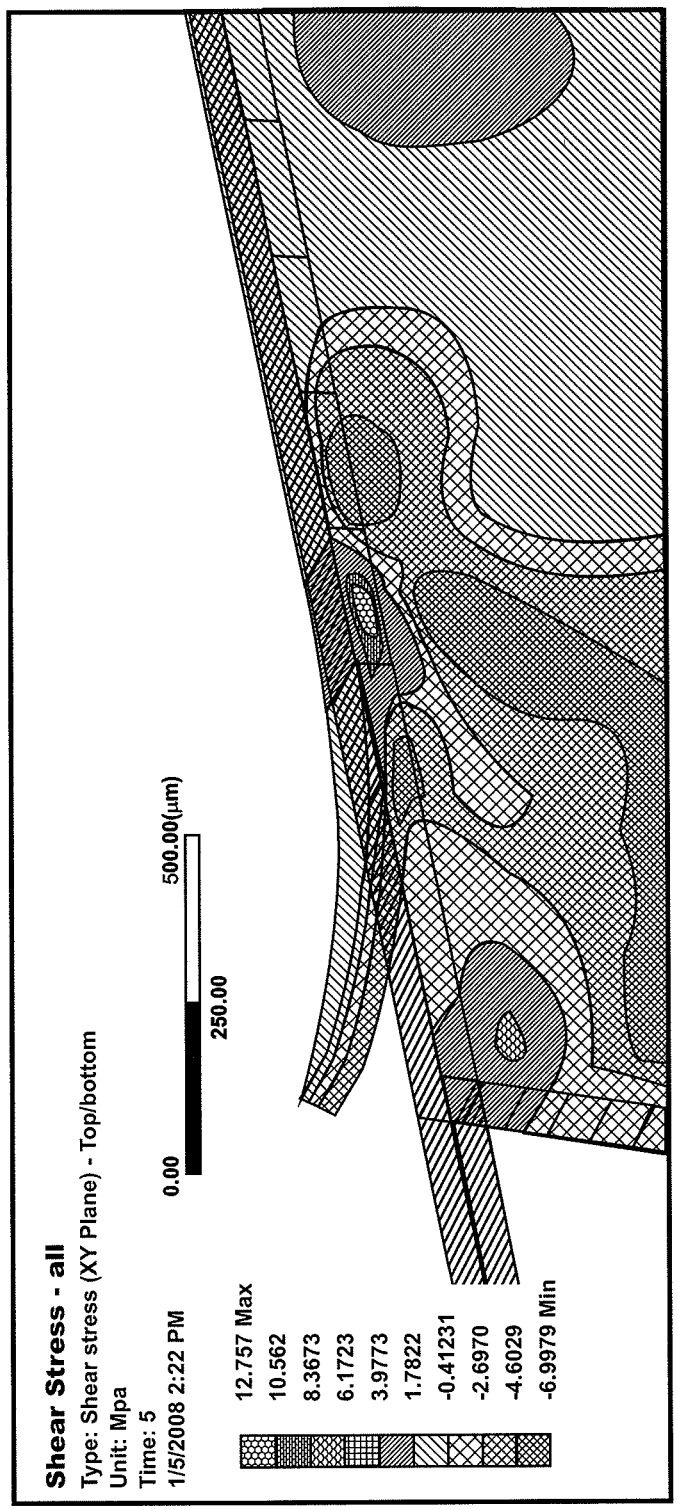

Next, as shown in FIG. 8B, a fast cooling transient is introduced to develop a tensile stress profile within the film to impart the necessary thermal stresses into the system. The tensile stress is made using an instant application of a 0° C. temperature on the surface for 30 µsec, to create a thermal load of −300° C. The short time assures that the tensile stress occurs almost entirely within the film thickness (h) on only one side of the cleave plane, and thus sufficient force P is developed to exceed the cleave fracture energies. The excessive value compared to the threshold value of 183° C. will also serve to confirm the ability of the process to achieve KII cancellation with a ramping thermal source that exceeds the threshold fracture energy value.

Note that using this thermal configuration, the application of the cooling transient must occur on a time scale shorter than the film thermal time constant. For a 50 um silicon film for example, the time constant is about $h^2/D_{th}$ or about 36 usec ($D_{th}$ is the silicon thermal diffusivity of about 0.7 cm$^2$/s). The cold shock can be applied using a stream of cryogenic liquid, solid or gas with enough heat transfer characteristics. Carbon dioxide snow ($CO_2$) or liquid nitrogen are two examples of source of the cold shock. Alternatively, the cold shock time constant can be relaxed (lengthened) by pre-heating the brick as appropriate, to induce the desired effective temperature differential.

FIG. 8B shows the thermal profile after this cooling transient application. The advantageous thermal profile of the tensile stress of the film results in the desirable KII=0 condition.

Using an applied pressure of 42 kPa, the crack propagation will occur at KII=0 once sufficient tensile stresses exist. For the more complicated thermal profile modeled here, the profiles of p and of temperature may be necessary to match the energy and KII cleave conditions using real-world approaches to heating and cooling.

The cleaving that occurs is controlled, and exhibits a double-step cleaving progression where the heating cycle does not propagate the cleave. The brief cooling transient causes the crack front to propagate to the next zone. FIGS. 9A-D show the heating/cooling cleaving sequence modeled by the AnSys software. The shear stress pictures show the cleave location and crack tip stresses clearly. Note that the heating cycle shows a lower positive shear, indicative of the lack of cleave energy available for propagation.

The application of a thermal load of this type can progress through successive scanning of the thermal load sequence, to propagate the cleave and separate a progressively larger portion of the film. Thus, an advantage of a constant moment loading is that after the application of the desired moment, the propagation keeps the moment at the desired value independent of the location of the cleave front.

Figure 10:
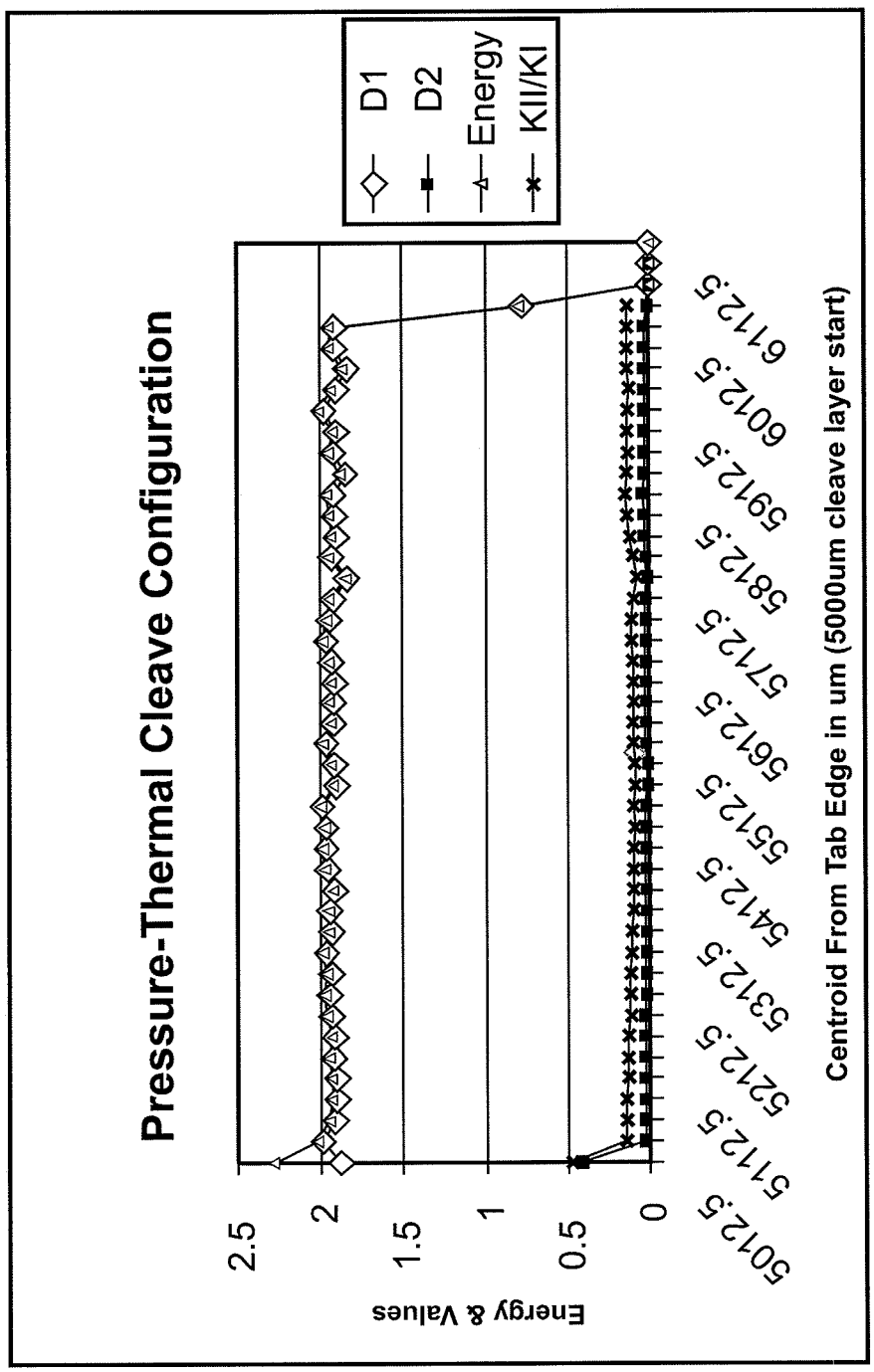
FIG. 10 shows the energy profile resulting from application of a thermal cleaving process.

FIG. 10 plots several values on a linear scale, as a function of distance (in µm) of the centroid of the zone from the tab edge of the substrate. FIG. 10 shows a first order reduction in KII as compared with the result of FIG. 5 above in the non-temperature (P=0) case. The FIG. 10 shows that KI is now the major stress intensity contributor to crack energy with D1 almost equal to the cleave energy 2*γ' or 2.4 J/m$^2$. The mixity KII/KI and D2 are very low, thus confirming the action of the cancellation configuration.

As shown in the model, cleaving progresses rapidly and controllably through each zone. Although the latter zones are 250 µm in length, this can be increased without compromising the cracking behavior, so long as the pressure be maintained as the cleave front propagates and the volume of the fracture increases as a result.

According to particular embodiments, scanning of the heat soak/cold shock sources could allow continuous propagation of the cleave front. For example, if 10 msec is used to cover a length of material of 250 um, a 156 mm tile could be cleaved in about 6 seconds. This assumes that the thermal and pressure loading is applied across a width of the tile, and linearly scanned at a rate of about 2.5 cm/sec.

While the above embodiments describe the performance of cleaving by application of a constant pressure in conjunction with repeated application of a thermal shock, this is not required by the present invention. In accordance with particular embodiments, the magnitude of the applied pressure can be changed to achieve desired cleaving properties.

Thermal Heating Shock Cleaving

Instead of using a cooling thermal shock ahead of the crack tip, a heating shock can be applied on the film behind the crack tip. To allow the thermal shock to efficiently develop P in this configuration, the thermal application develops the shock wave before there is a mechanical relaxation of the expansion through movement of the film away from the crack tip area.

In contrast with the cooling configuration where the thermal shock time is linked to the thermal time constant of the film, the film heating configuration is applied on a time scale on the same order as the acoustic time constant of the film material. The rapid heating is therefore applied in a very short time interval on the range of sub 100 nanoseconds to a few microseconds, depending on the width of the heat shock and its proximity to the crack tip.

To achieve the threshold crack propagation condition ($\Delta T=183°$ C.), for example on 50 um silicon within 250 nsec, a power density of over 6 MW/cm$^2$ is required. This is a very high power density that is within the adiabatic heating regime of silicon.

To avoid generating heating stresses along the depth of the silicon film that can lead to damage in the form of pits, surface melting, film breakage and cracking, volumetric heating is preferable over surface heating. Electron beam (E-Beam) heating is a good candidate technology to apply to this heating, as it can volumetrically heat a portion of the film (cleaved or uncleaved).

Figure 11:
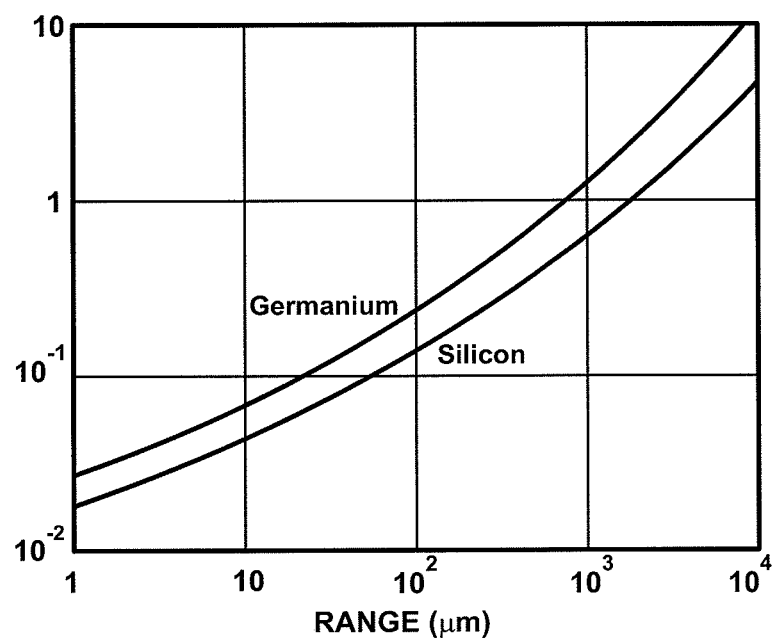
FIG. 11 shows the electron range into silicon and germanium as a function of electron energy.

E-beams are also highly controllable with the following general characteristics. E-Beams allow beam scanning over a large area with high controllability and speed. E-Beams allow fine control over beam intensity and diameter (micron to centimeter size). E-Beams allow control over pulsing from nanoseconds to CW. E-beams allow control over heating depth by changing electron beam energy (keV to MeV, corresponding to beam penetration ranges from a few microns to a few centimeters—see FIG. 11).

The power flux of the beam is therefore easily controlled by selecting the beam diameter, beam energy and beam intensity while the penetration range is selected by the beam energy. For example, 50 um electron beam penetration in silicon is about 80 keV and a 0.5 mm beam diameter would require a 200 mA beam intensity pulse for 250 nsec. Alternatively, a pulsed beam treatment could be made with a CW beam scanned sufficiently rapidly. For the example above, the required beam scan velocity would be 0.5 mm/250 nsec or 200,000 cm/sec. Most if not all of the above characteristics can be available in present system built for precision vacuum welding and material modification applications. For example, e-beam systems from Pavac Industries, Inc. (Richmond, B.C. Canada, www.pavac.com) and others could be used as an adiabatic heating source.

E-beams could control the propagation of the crack tip under KII cancelling configurations. E-beam technology can also be used for initiating a first area of film as well as possibly cleaving under pure shear conditions. These approaches are described below.

Control of Cleave Depth Using KII Canceling

Maintaining precise control over film thickness is important not only for achieving highly uniform films, but also to avoid cleave failures. The KII canceling scheme offers the inherent ability to control the propagating cleave depth, by modulating the applied moment as a function of active depth control feedback.

Equations 25 and 26 describe how KI and KII stress intensity factors change with applied loading. A rise of p will increase M, and thus cause an extending crack to become shallow as the cleaving propagates more towards the surface. Conversely, a lower p will require more thermal energy to achieve the fracture condition and move the crack deeper. Control over depth could therefore be made by modulating the pressure p while the crack is propagating to achieve the desired depth. This suggests that reduced dose or even no dose propagation is possible using this technology.

Applicability to Other Cleave Configurations than KII=0

While embodiments have been described above in connection with pressure cleaving in combination with the use of a thermal shock, this is not required by the present invention. In accordance with alternative embodiments, the cleave sequence could be modified such that the $\Delta_{KII-}$ and $\Delta_{KII+}$ factors are particularly high and can effectively guide the fracture propagation throughout the cleave sequence. In such embodiments, a single loading energy source (pressure or thermal) can drive the cleaving with non-zero KII. In such embodiments, the use of pulsed (time varying) pressure or scanning thermal/cooling sources could still confer controllability in cleave propagation. For example, a laser heating source could be used to generate a −P1 force to generate shear dominant (KII dominant) cleave conditions. The laser energy can be injected through heating of the silicon material ahead of the crack tip, as well as heating the film directly behind the crack tip and allowing heat conduction to further heat the specific crack tip area. Although the stress intensity mixity would favor crack propagation towards the surface, film compression due to the heating process would help to discourage propagation within the film and force shear-dominant propagation along the cleave plane.

Use of Thermal Shock Technologies for Film Initiation

The use of a patterned implant was described above in connection with allowing the lowest total dose film cleaving process. In the proposed process sequence, film initiation would be made on a higher dose area to partially release a film of a few millimeters in width. This partially released film can in turn can be used to propagate the balance of the cleaving under KII cancellation or other methods of film propagation.

The E-beam technology, laser or flashlamp technologies, could be used to detach the film from the substrate. The E-beam technology may be particularly suited for this purpose, as the energy range could be adjusted to allow film temperature to rise volumetrically within the initiation area close to the edge of the substrate. The pulsed energy would deposit over time within the film thickness, an almost constant $\Delta T$ rise in temperature, with a sharp change in temperature profile adjusted to be located at or near to the cleave plane.

Figure 13:
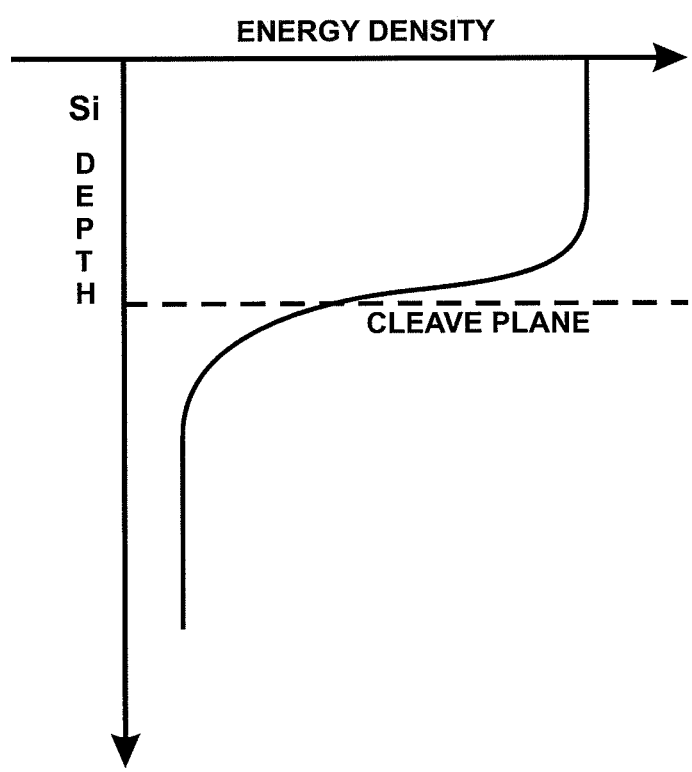
FIG. 13 plots energy density versus depth into silicon resulting from the adiabatic heating resulting from application of an electron beam over a time period.

Such adiabatic heating of silicon by E-beam exposure is shown in FIG. 13, which plots energy density versus depth into silicon, for E-beam irradiation over a time period where some temperature averaging occurred within the film volume. According to particular embodiments of the present invention, the abrupt change in temperature gradient resulting from adiabatic E-beam heating may comprise a change of greater than 10° C./μm.

For example, a 250 nsec pulse would only diffuse the thermal profile by about 5 um, substantially less than the film thickness. This would generate a shear cleave that would limit the presence of thermal shocks across the thickness of the film, and produce a large shear that can controllably cleave the film. The initiation cleaving could start at an edge and be extended to cover the desired film width to support the propagation cleave method. Alternatively, the initiation cleaving could start at an interior location and then extend to the periphery. If an internal initiation cleaving is used, a vacuum environment would benefit the cleaving process by reducing the energy needed for film buckling since there will not be any appreciable pressure developing a restoring force to the upwards film movement.

Use of Thermal Shock Technologies for Film Propagation

An intense thermal shock pulse in combination with constant volumetric heating characteristics could also be used to propagate the film from the initiation region. With E-beam technology in particular, a fast pulse application that can heat the film thickness uniformly, could allow the controlled propagation of the film by pure shear cleaving or with a moment assist. The use of E-Beam technology for cleaving of films is described in U.S. Pat. No. 6,013,563, which is incorporated by reference in its entirety herein for all purposes. In accordance with particular embodiments of the present invention, the E-Beam radiation may be applied in a direction perpendicular to a face of the substrate.

The matching of the E-beam volumetric heating (end of range or Rp) can be made by selecting a higher or lower energy e-beam. The E-beam energy can be selected so that its Rp is about the thickness of the film to be cleaved, although in practice an effective control of the cleave depth may have some offset between the cleave depth and Rp.

The use of E-beam radiation may be particularly favored here because the energy range could be adjusted to allow a film temperature rise volumetrically within the propagation area close to the crack tip, but just within the uncleaved area. The pulsed energy would deposit within the film thickness an almost constant $\Delta T$ rise in temperature, with a sharp change in temperature profile adjusted to be at or near to the cleave plane.

For example, a 250 nsec pulse would only diffuse the thermal profile by about 5 um, substantially less than the film thickness. This would generate a shear cleave that would limit the presence of thermal shocks across the thickness of the film and produce a large shear that can controllably cleave the film.

To quantify this regime, the KI and KII equations 26 & 27 can be modified with p=0 and to yield the following relations:

$$KI = \alpha_{CTE} * E * h^{1/2} * \Delta T * \cos(\omega)/\mathrm{sqrt}(2) \tag{30}$$

$$KII = \alpha_{CTE} * E * h^{1/2} * \Delta T * \sin(\omega)/\mathrm{sqrt}(2) \tag{31}$$

The thermal only cleave energy equation can be derived as:

$$G' = 2*\gamma' = 1/2 * \alpha_{CTE}^2 * E * h * \Delta T^2 * (1-v^2) \tag{32}$$

For KII shear cleaving, the required thermal heating across h is therefore:

$$\Delta T = [4*\gamma'/\alpha_{CTE}^2 * E * h * (1-v^2)]^{1/2} \tag{33}$$

As an example, a 50 um silicon layer with 1.2 J/m² would require about 300° C. of near-instantaneous temperature rise. Assuming about 0.7 J/cm²-° C., the required energy deposition on the silicon surface is about 2.44 J/cm². Using an 80 keV E-beam pulse with a 0.5 mm×0.5 mm beam spot and 250 nsec beam pulsewidth, for example, corresponds to a beam intensity of about 300 mA. This is well within current E-beam technology.

If a moment is added, the G' equation is modified to:

$$G' = 2*\gamma' = 1/2 * \alpha_{CTE}^2 * E * h * \Delta T^2 * (1-v^2) + 6*(1-v^2)*M^2/E*h^3 \tag{34}$$

This equation shows that the use of a moment is additive and will reduce the temperature $\Delta T$ needed to achieve the crack extension condition.

Figure 12A:
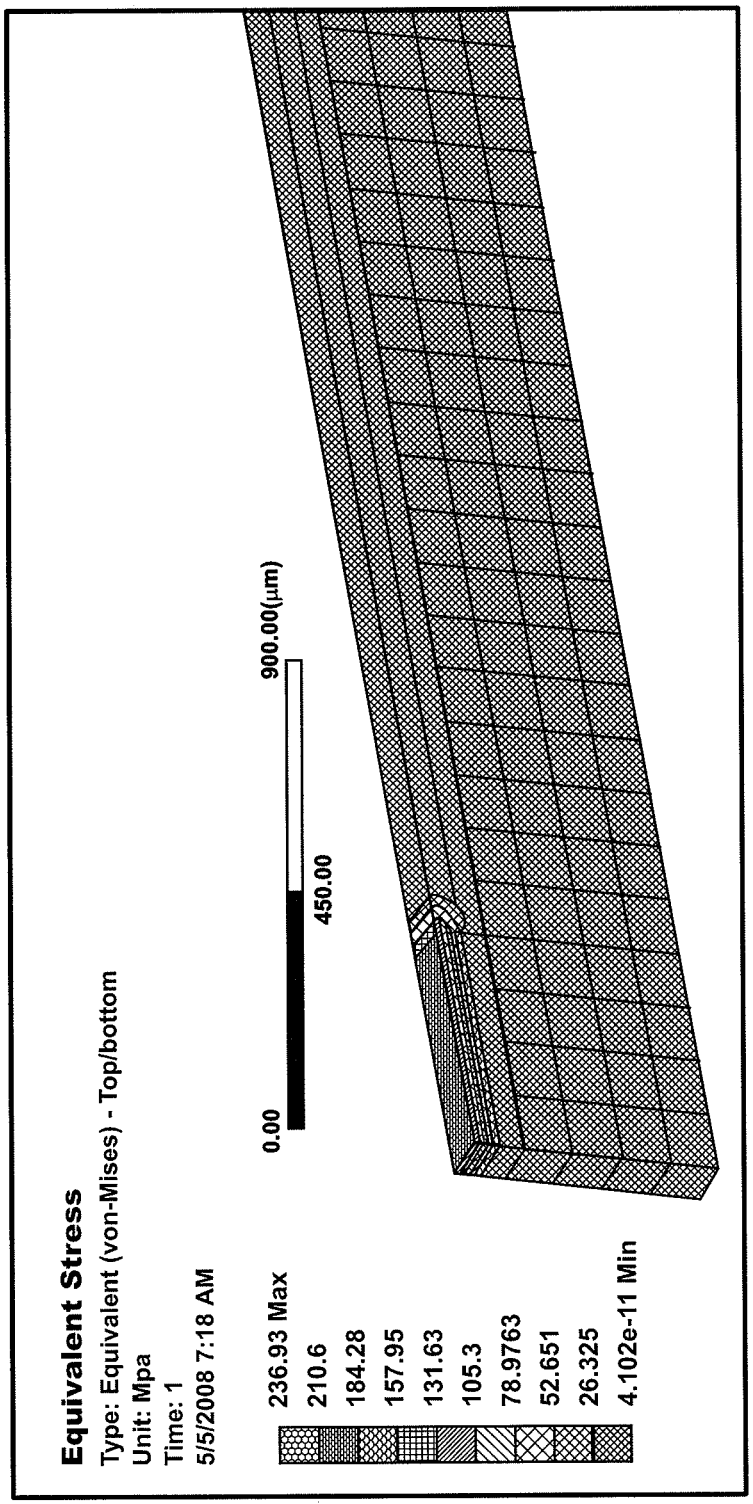
FIG. 12A-C shows the resultant film stress and cleave conditions upon moment loading, at the start and near the end of an adiabatic heating pulse.
Figure 12B:
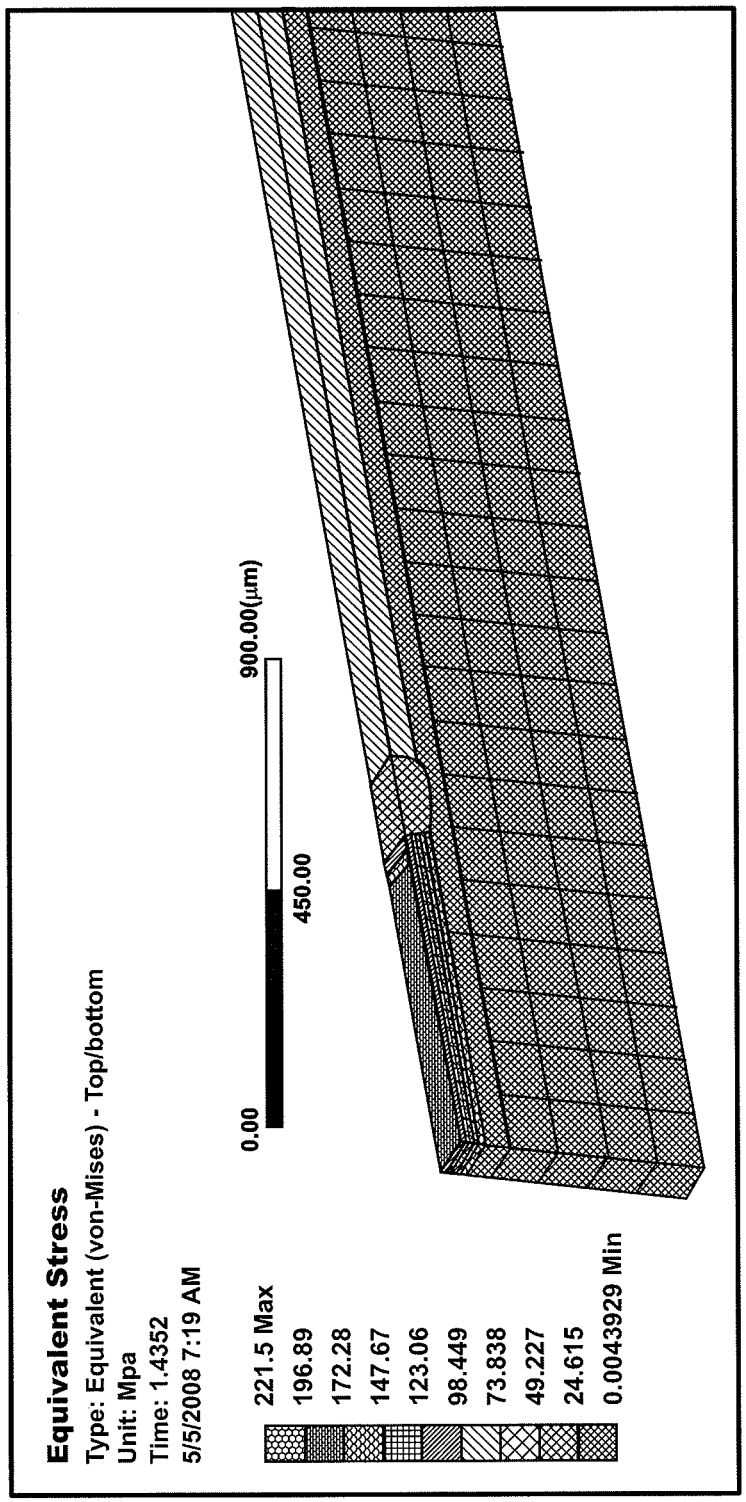
Figure 12C:
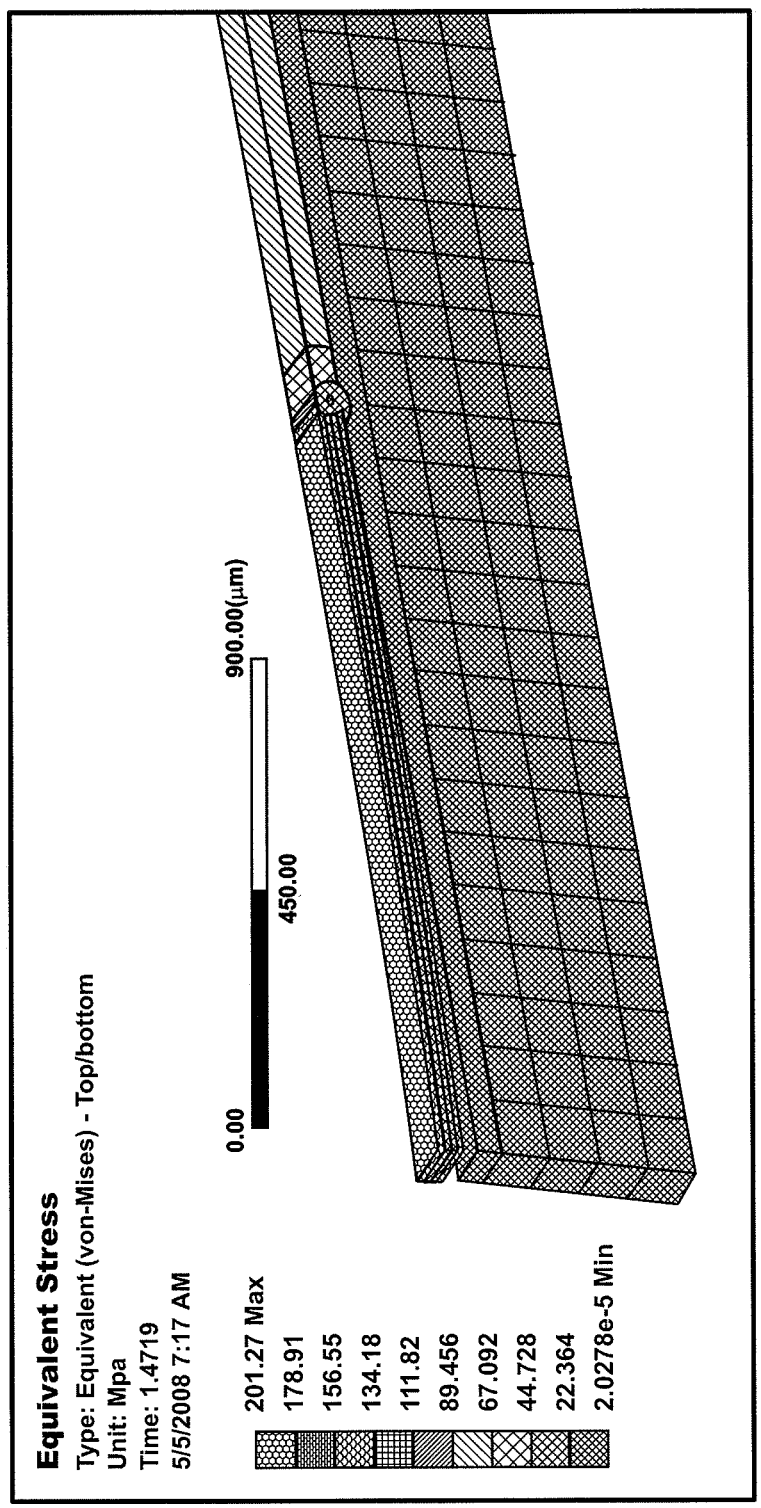

The AnSys software was used to confirm this cleave propagation mode. FIG. 12A-C shows a 50 um silicon film cleave FEA static structural simulation. In FIG. 12A, a moment M=0.08 N-m was applied on the starting film (on the first 500 um film segment). A positive temperature ramp on the film was started and led to buckling decohesion of the film. FIG. 12C shows the cleave propagating to the end of the heated zone.

With a moment of 0.08 N-m, the $\Delta T$ onset of propagation was calculated from equation 35 as 180° C. This agrees very well with the Ansys value of 176° C. By contrast, absent a moment, the value is about 300° C. These results show that buckling film decohesion (moment assisted or not) is a practical cleave configuration.

The use of E-beam heating methods would be beneficial in this mode, since the rapid adiabatic heating will give a sharp compressive stress profile that can help guide the propagating cleave. Cleave depth could also be controlled by altering the E-beam energy, thus changing the thickness of the film that is subjected to volumetric heating.

Selection of the heated zone width was also confirmed to yield control over cleave extension. The heated zone width will dictate, to first order, the amount of crack extension that will occur upon the heating cycle. This is because after the cleave front has reached the edge of the heated cleave area, G' will drop and the propagating cleave will arrest.

Lastly, any of the heating techniques used in conjunction with an implanted cleave layer could help use the implant induced stresses more efficiently. This would occur by the higher temperature, which would in turn increase the implant stresses (these are usually proportional to kT). A heated pulse could therefore have a secondary, favorable effect on the cleave plane, enhancing stresses in the cleave plane for better guidance of cleave propagation.

If a cleave propagation action occurs with fracture energy G' at least partly comprising release of a stored positive moment energy (for example with a hydrogen cleave plane with the compressive layer situated at the bottom of the film), a vacuum environment could benefit the cleaving process. Specifically, a vacuum environment could allow for more efficient release of energy, as there will not be any appreciable pressure developing a restoring force to the upward film movement. For example, if a thermal shear cleave mode is employed, the use of a vacuum will also tend to reduce the negative KI stress intensity that is known to potentially increase fracture toughness (effective fracture energy G'). It is worthy of noting that high vacuum conditions are not required, and even a partial vacuum of many Torrs could demonstrate this effect.

The continuation of the cleave process would eventually result a complete lift off of a thick film along the cleave region, out of the remaining portion of the semiconductor substrate. In one embodiment, this remaining portion with a newly exposed surface region, is in condition for repeating the cleaving method by again performing the cleave initiation and propagation methods.

A cleavage plane of lower surface energy may be selected as the surface region for the semiconductor substrate. Thus, in an embodiment, after one thick film is lifted off from the substrate, a new surface plane would be substantially in the original crystallographic plane and in a good condition, with relatively small surface roughness for additional layer transfer production without need of complicated surface treatment like etching or polishing.

Of course, there can be other variations, modifications, and alternatives. Depending upon the embodiment, the processes can be for the formation of photovoltaic cells, integrated circuits, optical devices, any combination of these, and the like.

Consideration of $M_2/P_2$ and $M_3/P_3$ Factors in Cleaving

Returning to FIG. 2, equation (6) is again reproduced below.

$$G' = \frac{1}{2E}\left[\frac{P_1^2}{h} + 12\frac{M_1^2}{h^3} + \frac{P_2^2}{H} + 12\frac{M_2^2}{H^3} - \frac{P_3^2}{h+H} - 12\frac{M_3^2}{(h+H)^3}\right] \tag{6}$$

In this equation (6), terms three through six may also be considered in designing a process to achieve desirable cleaving of a film from a workpiece such as a tile or substrate.

For example, forces $P_2$, $M_2$, $P_3$, and $M_3$ may be exerted in a number of ways during cleaving. According to certain techniques, the tile may be fixed in position while it is subjected to processes that generate tensile and/or compressive stress in the tile.

In certain embodiments, the tile could be fixed in position by clamping the ends of the tile. In such an embodiment, a clamp could engage a notch or groove present in the side of the tile. Such a notch or groove may be intentionally machined in the tile for this purpose.

In other embodiments, the tile could be fixed in position by securing the tile from below, for example by electrostatic or vacuum chucking. In still other embodiments, a tile could be secured from both the bottom and the sides. In these embodiments, efficient generation of tile/substrate M and P terms could require the clamping or fixing method to allow for the generation or control of one or more of P2, M2, P3, and M3.

Figure 14:
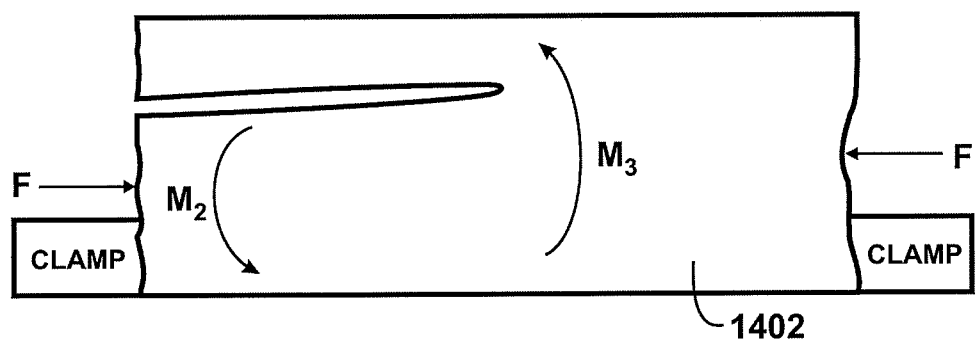
FIG. 14 is a simplified cross-sectional view showing cleaving by the generation of moments $M_2$ and $M_3$ by direct application of force to edges of a clamped substrate.

Any one of a number of techniques could be employed to generate the desired tensile and/or compressive stresses within the tile. For example, as shown in FIG. 14, one approach is to clamp the tile 1402 in place, while directly applying force(s) F to the tile edge(s). This approach could generate directly in the tile, moments $M_2$ and $M_3$ (and associated $P_2$ and $P_3$) of sufficient magnitude to significantly influence the equation (6).

Another approach is to generate a local temperature gradient of sufficient intensity, that differences in expansion at various depths in the tile give rise to the requisite strain. Such an approach is illustrated in FIG. 15, where a localized thermal gradient 1500 is generated in clamped tile 1502 by application of a laser beam 1504.

Figure 15:
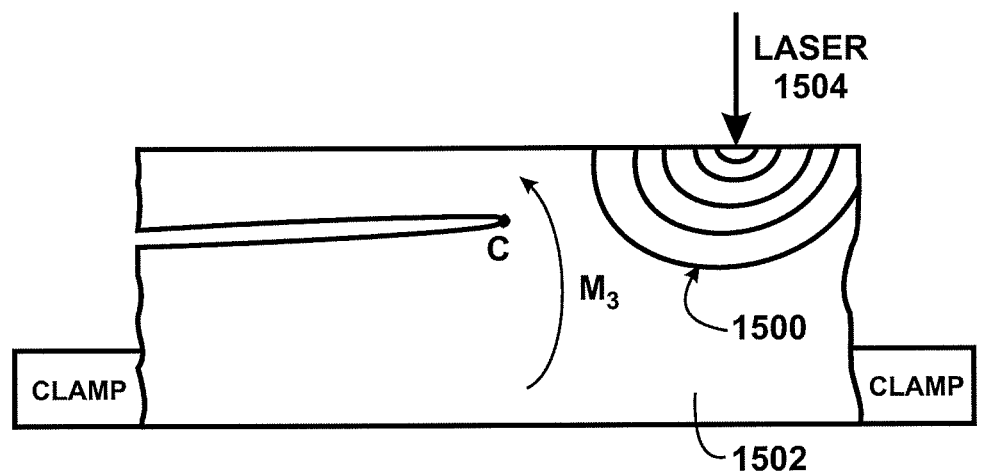
FIG. 15 is a simplified cross-sectional view showing cleaving by the generation of moments $M_1$-$M_3$ and forces $P_1$-$P_3$ resulting from the application of thermal energy to a clamped substrate.

As shown in FIG. 15, thermal gradient 1500 is sufficiently distant from point C of the front at which cleaving is taking place, that the temperature from the laser does not itself influence cleaving energy. More specifically, the energy from the thermal gradient does not appreciably affect the magnitude of the term P of equation (19). Instead, the energy is coupled through to the crack by stresses and moments generated from the laser-induced heated volume situated some distance away for the crack tip.

However, as a result of application of the laser, material at different depths in the tile experience different amounts of thermal expansion. This difference in thermal expansion versus depth, in turn can give rise to compressive stress of sufficient magnitude to generate a moment $M_3$ that influences the equation (6).

While the embodiment of FIG. 15 shows generation of the thermal gradient by application of a laser to the top surface of the tile, this is not required. In accordance with other embodiments, a thermal gradient of desired intensity could be generated by the application of energy in another form, such as an electron beam. Moreover, energy could be applied to other surfaces of the tile, including the sides or the bottom. Moreover, the energy applied to the tile need not be limited to a single source having local effect. In accordance with other embodiments, a global increase in temperature of the tile (such as a pulsed heating of the top or bottom surface) can contribute partially or wholly to the initiation and/or propagation of a cleave front.

Still another approach to generating moments $M_2/M_3$ to achieve cleaving, is through the application of sonic energy. Some embodiments of such approaches are illustrated in FIGS. 16-17.

Figure 16:
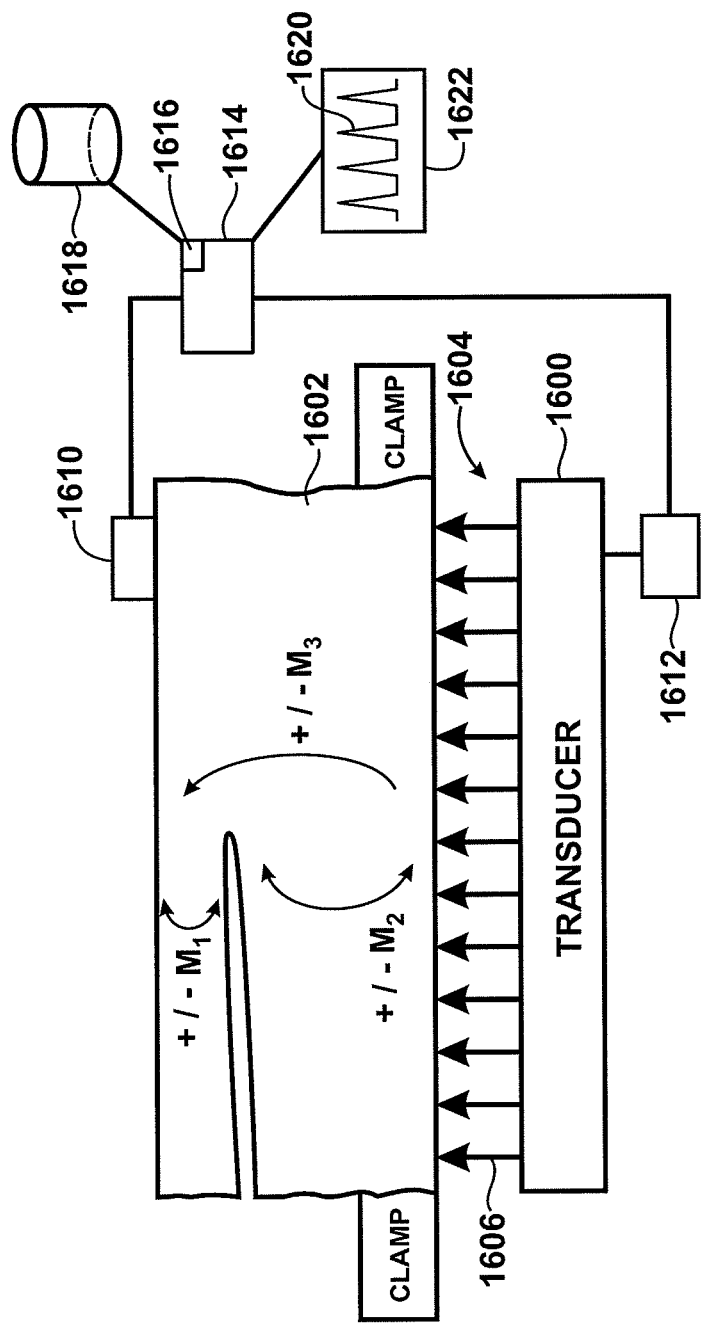
FIG. 16 is a simplified schematic view showing cleaving by the generation of moments $M_1$, $M_2$, and $M_3$ resulting from the application of sonic energy to a clamped substrate.
Figure 17:
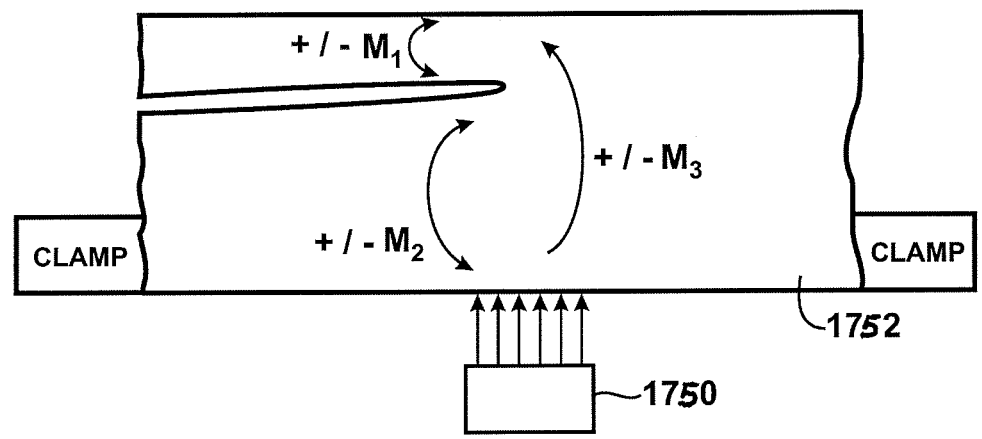
FIG. 17 is a simplified schematic view showing cleaving by the generation of moments $M_1$, $M_2$, and $M_3$ resulting from the local application of sonic energy to a clamped substrate.

FIG. 16 shows a simplified schematic view of one embodiment, wherein transducer 1600 is separated from tile 1602 by medium 1604. Sonic energy 1606 from transducer 1600 is applied to the clamped tile 1602 through medium 1604, which may be air, but may alternatively comprise a liquid or other gas to enhance coupling of the sonic energy to the tile.

Sonic energy impacting the tile gives rise to oscillation by the tile. Where the character (i.e. frequency, wavelength) of the applied sonic energy matches harmonics of the tile, resonant energy can rapidly build up in the tile.

Such oscillation is shown in FIG. 16. In particular, As shown in this figure, sonic energy impacting the tile gives rise to oscillation by the tile, including the partially detached film, portions underlying the partially detached film, and portions of the tile that have not yet been cleaved. Such oscillations in turn create both positive and negative moments (respectively $M_1$, $M_2$, and $M_3$) that may be of a sufficient magnitude to influence cleaving. Moreover, such energy build up is particularly likely in the solid, crystalline materials that are generally the target of cleaving, as those solid crystalline materials typically exhibit a large quality (Q) of resonance.

Detection of the harmonics in a tile is straightforward. As shown in FIG. 16, a microphone 1610 may be placed in contact with or proximate to tile 1602. Input from the microphone may be input to host computer 1614 comprising processor 1616 in communication with a computer-readable storage medium 1618.

Controller 1612 scans the frequency of sonic energy emitted by the transducer. Matching of the frequency of applied sonic energy with a harmonic of the tile, is revealed by emission of a sound of particularly high intensity by the microphone. Such a particularly high intensity sound may be indicated by one of the peaks 1620 shown on display 1622 that is in electronic communication with host computer 1614.

While FIG. 16 shows an embodiment wherein the transducer is sonically coupled to the tile through a medium, this is not required. In an alternative embodiment, a transducer may be in direct physical contact with the tile in order to give rise to cleaving.

Moreover, while FIG. 16 shows an embodiment wherein sonic energy is applied globally to the tile, this is also not required. For example, as shown in the alternative embodiment of FIG. 17, the transducer 1750 may be smaller than the tile 1752, and positioned to apply sonic energy directly to only a portion thereof. In some embodiments, the transducer may be configured to move across the surface of the tile to provide sonic energy at or in front of an advancing the cleave front.

The development of moments and forces $M_2/M_3$ and $P_2/P_3$ can be selected in a static fashion (clamp or bending), or in an oscillatory fashion (such as with the use of sonic or ultrasonic transducers) in a manner where the local crack tip stress intensity KI and MI is adjusted to lower, cancel or control MI. These external forces and moments can thus not only add energy to the crack tip, but if properly selected can also help control propagation within a desired cleave plane. For example, bending the tile in a $+M_2$ and $-M_3$, or heating the tile bottom in a pulsed fashion will generate a +KII component that could help cancel KII.

While the above description focuses upon the application of a thermal shock utilizing localized application of thermal energy to the surface followed by localized cooling of the surface, this is not required. In certain embodiments, the desired conditions could be achieved by global application of one or both of the thermal energy or the cooling. And, in certain embodiments, the thermal energy and/or the cooling could be applied to a location other than the surface, for example a backside of a wafer or a side of the wafer. Moreover, in certain embodiments, cooling alone could be employed to achieve the desired result, whether in the active application of negative thermal energy, or in the passive dissipation of heat through the substrate material and/or into the surrounding environment.

While the above is a full description of the specific embodiments, various modifications, alternative sequences and devices may be used. For example, while the use of a vacuum force to peel away the cleaved film was described above in connection with a constraint plate, this is not required, and an electrostatic force could be used. In accordance with alternative embodiments, a vacuum force or an electrostatic force can be employed in an absence of a constraint plate, to draw the cleaved film away from the remaining substrate as the cleave front advances.

Figure 18:
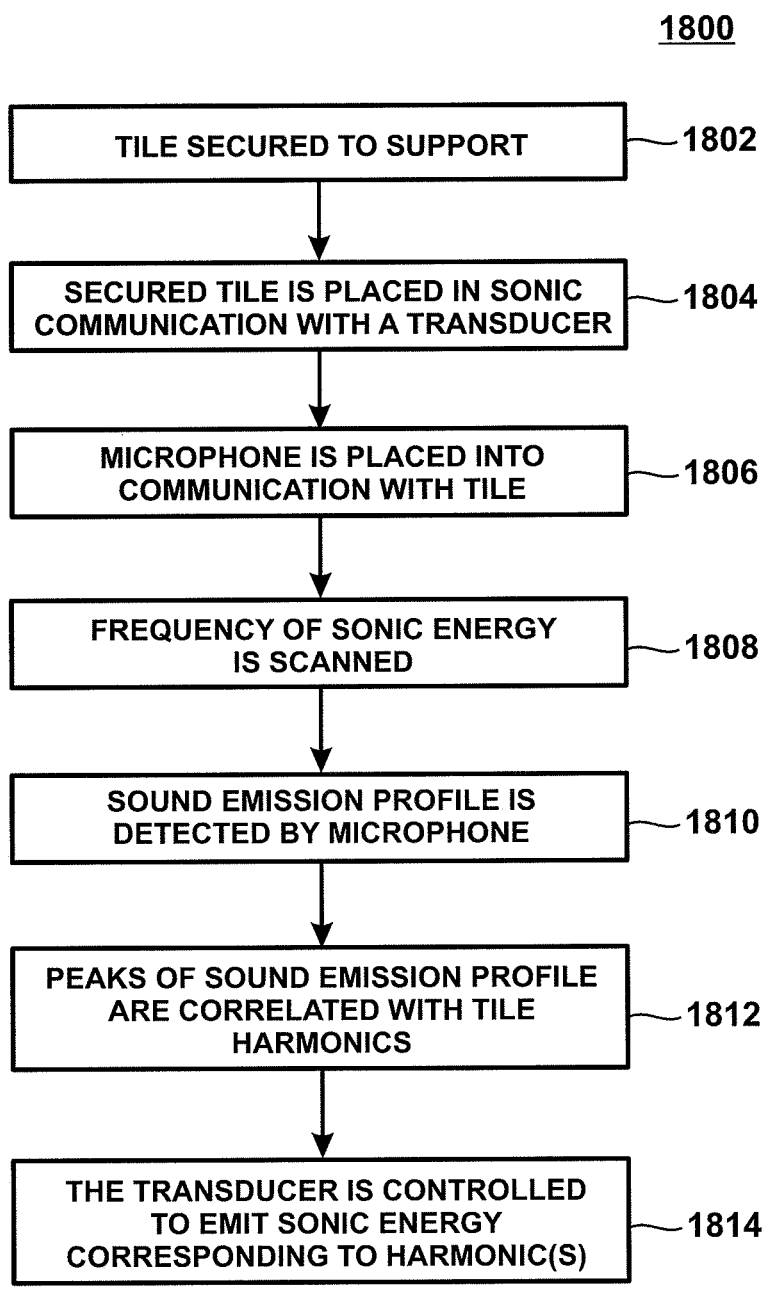
FIG. 18 is a simplified process flow showing the steps of an embodiment of a process in accordance with the present invention.

FIG. 18 shows a simplified flow diagram illustrating steps of a process 1800 to achieve cleaving employing sonic energy in accordance with an embodiment of the present invention. In a first step 1802, the tile is secured to a support, such as a chuck or side clamping. In a second step 1804, the secured tile is placed in sonic communication with a transducer. In a third step 1806, a microphone is placed in communication with the tile. In a fourth step 1808, a frequency of sonic energy emitted by the transducer is scanned over a range. In a fifth step 1810, the microphone is used to detect a sound emission profile of the substrate over the scanned frequency range. In a sixth step 1812, peaks in the sound emission profile are correlated with harmonics of the secured tile. In a seventh step 1814, the transducer is configured to emit sonic energy of a frequency known to correlate with one or more harmonics of the secured substrate, in order to promote cleaving of a film from the substrate.

Although the above has been described using a selected sequence of steps, any combination of any elements of steps described as well as others may be used. Additionally, certain steps may be combined and/or eliminated depending upon the embodiment.

The type of ionic particles that are implanted to form a cleave region can be varied from hydrogen ions to helium ions, deuterium ions, or certain combinations to allow for formation of the cleave region according to alternative embodiments.

Still further, the cleaving process may include temperature controlled/assisted cleaving utilizing vacuum chucking or electrostatic chucking process. Of course there can be other variations, modifications, and alternatives.

Therefore, it is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of cleaving a film from a substrate, the method comprising:
providing a substrate having a top surface and a bottom surface, both the top surface and the bottom surface extending to edges of the substrate in all directions, the substrate having a top region defined between the top surface and a plane at a depth beneath the top surface, the top region extending to edges of the substrate in all directions, wherein the top region is separated from a bottom region of the substrate by a cleave region;
applying a thermal source having a predetermined energy in a direction perpendicular to the top surface to create a volume of heated material between the cleave region and the top surface, the heated volume exhibiting a substantially uniform temperature profile followed by a drop in temperature is 10° C./μm or greater at the cleave region; and
cleaving the film from the substrate at the cleave region.

2. The method of claim 1, wherein the thermal source is applied by delivering pulsed energy to the top surface.

3. The method of claim 2, wherein the pulsed energy is laser energy.

4. The method of claim 2, wherein the pulsed energy is an e-beam.

5. The method of claim 1, wherein the drop in temperature is used to create a crack initiation site.

6. The method of claim 5, wherein the crack initiation site is disposed in an interior of the substrate.

7. The method of claim 6, wherein the method is performed in a vacuum that impedes buckling compared to a non-vacuum environment.

8. The method of claim 5, wherein the crack initiation site is at an edge of the substrate.

9. The method of claim 1, wherein the drop in temperature propagates a crack along the cleave plane.

10. The method of claim 9, wherein the thermal source is applied by a pulsed e-beam.

11. The method of claim 10, wherein the e-beam has an Rp that is about the same as a thickness of a film to be cleaved.

12. The method of claim 1, wherein the sharp drop in temperature results in a controlled shear at the cleave region, and
wherein the thermal source comprises a laser scanned with a propagating crack to generate shear dominant cleave conditions within the cleave region.

13. The method of claim 12 wherein:
the thermal source is applied at a distance ahead of the crack;
a thermal gradient arises from the substantially uniform temperature profile followed by the sharp drop in temperature; and
energy from the thermal gradient is coupled across the distance through to the crack by moments and stresses within the cleave region.

14. A method of cleaving a film from a substrate, the method comprising:
providing a substrate having a top surface and a bottom surface, both the top surface and the bottom surface extending to edges of the substrate in all directions, the substrate having a top region defined between the top surface and a plane at a depth beneath the top surface, the top region extending to edges of the substrate in all directions;
creating a temperature gradient at the depth and a tensile stress in the top region, such that the substrate causes the top region to cleave from the underlying portion of the substrate; and
applying pressure to a side of the substrate to further cleave the top region from the underlying portion.

15. The method of claim 14, wherein the thermal source is applied by delivering pulsed energy to the top surface.

16. The method of claim 14, wherein the temperature gradient is 10° C./μm or greater.

17. The method of claim 14, wherein the thermal source is applied by a pulsed e-beam.

18. The method of claim 17, wherein the e-beam has an Rp that is about the same as a thickness of a film to be cleaved.

19. The method of claim 14, wherein movement of the top surface is constrained.

* * * * *